(12) United States Patent
Ahn et al.

(10) Patent No.: US 7,776,685 B2
(45) Date of Patent: Aug. 17, 2010

(54) COPOLYMERS, POLYMER RESIN COMPOSITION FOR BUFFER LAYER METHOD OF FORMING A PATTERN USING THE SAME AND METHOD OF MANUFACTURING A CAPACITOR USING THE SAME

(75) Inventors: Sun-Yul Ahn, Anyang-si (KR);
Kyong-Rim Kang, Seongnam-si (KR);
Tae-Sung Kim, Suwon-si (KR);
Young-Ho Kim, Yongin-si (KR);
Jung-Hoon Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/379,348

(22) Filed: Feb. 19, 2009

(65) Prior Publication Data
US 2009/0162986 A1 Jun. 25, 2009

Related U.S. Application Data

(62) Division of application No. 11/447,120, filed on Jun. 6, 2006, now Pat. No. 7,514,319.

(30) Foreign Application Priority Data

Aug. 20, 2005 (KR) ................................ 2005-76529

(51) Int. Cl.
*H01L 21/8242* (2006.01)
(52) U.S. Cl. ...................... 438/253; 438/256; 438/396; 438/399; 257/E21.648
(58) Field of Classification Search ................. 438/253, 438/256, 396, 399; 257/E21.648
See application file for complete search history.

(56) References Cited

U.S. PATENT DOCUMENTS 6,171,902 B1    1/2001 Ida (Continued)

OTHER PUBLICATIONS

Material Letter 57, Apr. 2003, USA, Tzong-Shing.*

*Primary Examiner*—Thanhha Pham
*Assistant Examiner*—Tony Tran
(74) *Attorney, Agent, or Firm*—Harness, Dickey & Pierce, P.L.C.

(57) ABSTRACT

The invention is directed to particular polymer compositions that may be generally characterized by the formula:

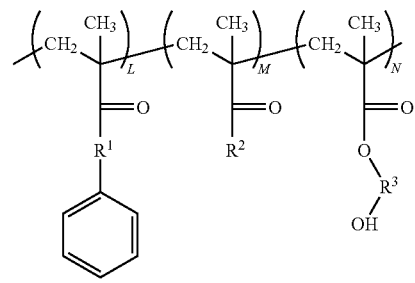

wherein the variables L, M and N represent the relative molar fractions of the monomers and satisfy the expressions $0<L\leq 0.8$; $0<M\leq 0.2$; $0<L\leq 0.35$; and $L+M+N=1$; and, wherein $R^1$, $R^2$ and $R^3$ are independently selected from $C_1$-$C_6$ alkyls and derivatives thereof. The invention is also directed to polymer compositions that, when used to form a buffer layer or pattern, can be more easily removed from the surface of a semiconductor substrate, thereby increasing productivity and/or reducing the likelihood of defects and failures associated with residual photoresist material.

14 Claims, 19 Drawing Sheets

U.S. PATENT DOCUMENTS

| | | |
|---|---|---|
| 6,372,572 B1 | 4/2002 | Yu |
| 6,700,153 B2 | 3/2004 | Oh |
| 7,189,341 B2 * | 3/2007 | Li et al. ..................... 252/511 |
| 2003/0124797 A1 | 7/2003 | Kim |

* cited by examiner

COPOLYMERS, POLYMER RESIN COMPOSITION FOR BUFFER LAYER METHOD OF FORMING A PATTERN USING THE SAME AND METHOD OF MANUFACTURING A CAPACITOR USING THE SAME

PRIORITY STATEMENT

This is a Divisional Application of, and claims priority under 35 U.S.C. §120 to, U.S. application Ser. No. 11/447,120, filed on Jun. 6, 2006 now U.S. Pat. No. 7,514,319, which also claims the benefit of Korean Patent Application No. 2005-0076529, filed on Aug. 20, 2005, in the Korean Intellectual Property Office, the disclosure of which is incorporated herein, in its entirety, by reference.

BACKGROUND OF THE INVENTION

1. Field of the Invention

Embodiments of the invention include polymeric compounds, and compositions including such compounds, that may be used in forming barrier layers for protecting underlying materials and structures and methods of utilizing such compounds and compositions. For example, compounds and compositions according to example embodiments of the invention may be used in manufacturing semiconductor integrated circuits, particularly with respect to methods for forming photoresist barrier layers and/or patterns that will provide satisfactory protection for underlying materials and structures while also simplifying the subsequent removal processes.

2. Description of the Related Art

In fabrication processes used for manufacturing semiconductor devices, photolithographic processes are used repeatedly to form a wide variety of films and patterns at different stages of the fabrication process. As semiconductor devices have become more highly integrated, the critical process dimensions, for example, the spacing between adjacent conductive lines, are being reduced accordingly. The increased degree of integration has led to other changes in the fabrication process as well including, for example, delaying formation of capacitor structures until after formation of the bit lines in semiconductor memory devices such as DRAMs to provide additional surface area for capacitor formation. The processes developed for forming capacitor structures typically include a series of sacrificial and barrier layers that are used in combination with one or more of deposition, planarization and etch processes to obtain the desired structure(s).

Due to the technical requirements associated with achieving higher degrees of integration in semiconductor devices, there has been continuing emphasis on reducing the surface area required for forming a memory cell in semiconductor memory devices. These efforts have led to difficulties in forming capacitors having a sufficient storage capacitance within the memory cell. Various methods have been proposed and/or adopted for maintaining the capacitance of such storage capacitors at acceptable levels in a reduced cell area. One approach involves increasing the height of the storage node by, for example, increasing the height of the lower electrode of a capacitor to form what is widely referred to as a cylindrical capacitor.

Examples of such cylindrical capacitor structures are disclosed in U.S. Pat. Nos. 6,700,153 and 6,171,902, the disclosures of which are hereby incorporated, in their entirety, by reference to the extent consistent with the present disclosure.

One such conventional method for fabricating a type of One Cylinder Storage (OCS) capacitor that can be used, for example, as the charge storage device in a DRAM memory cell, is illustrated in FIGS. 1A-1E. As illustrated in FIG. 1A, a substrate is prepared with both insulating regions 1, for example, an interlayer oxide, and a conductive regions 2, such as a contact plug or a pad plug for establishing electrical contact with conductive regions formed below the conductive regions.

A stop layer 3 may then be formed on both the insulating regions and conductive regions 2, with a molding layer 4, typically formed from an insulating material, for example, a silicon oxide, then being formed on the etch stop layer 3. The molding layer is then patterned and etched using a suitable photolithographic process (not shown) to remove the molding layer 4 and the stop layer 3 from regions of the substrate to form an opening 6 and thereby expose an upper surface of the conductive region 2. This opening 6 formed in the molding layer will, in turn, serve as the "mold" pattern for the subsequently formed capacitor structure. The photoresist pattern used as an etch mask (not shown) is then removed and the exposed surfaces cleaned in preparation for additional processing.

One or more layers of conductive material 7, 8, for example, a primary conductive layer may be combined with a barrier layer and/or an adhesion promoting layer in order to form a multilayer conductive stack structure having a desired combination of properties. One such combination of materials used for forming conductive material layers 7, 8 is a metal and the corresponding metal nitride. The conductive material layer(s) are formed on the exposed surfaces of the mold pattern structure including the upper surface of the remaining portions of the molding layer 4, the sidewalls of the opening 6 and the surface of the conductive region 2 exposed at the bottom of the opening. As illustrated in FIG. 1B, an insulating buffer layer 10, for example, a CVD oxide, is then formed on the conductive material 7, 8 to a thickness sufficient to fill the opening 6. As the aspect ratio of the opening 6 increases, however, the chance that the deposition will seal the mouth of the opening before completely filling the opening increases. In such instances, a generally centrally located void 12 will remain within the opening 6.

As illustrated in FIG. 1C, the upper portion of the insulating buffer layer 10 can be removed using any suitable blanket etch or chemical mechanical polishing (CMP) method to expose an upper surface of the conductive material 7, 8. As illustrated in FIG. 1D, the upper portion of the conductive material layers 7, 8 and additional upper portions of the insulating buffer layer 10 can then be removed using any suitable method (or combination of methods) including, for example, blanket dry (plasma) etch-back or CMP processing, thereby leaving only those portions of the insulating buffer layer 10 and the conductive material layers 7, 8 that were in the remaining portion of the opening 6.

As illustrated in FIG. 1E, the remaining portions of the molding layer 4 and the insulating buffer layer 10 are then removed either simultaneously with an appropriate etch, for example a wet etch using a low ammonium fluoride liquid (LAL) etch composition or sequentially using a sequence of suitable etch compositions and/or methods. During removal of these layers, the remaining portion of the void 12 may complicate the processing by effectively reducing the thickness of the insulating buffer layer 10 relative to the remaining portions of the molding layer 4.

Depending on the combination of conductive layer 7, 8 composition, insulating buffer layer 10 composition and the etch chemistry or chemistries utilized to remove these layers, the central portion of the conductive layers 7, 8 above the conductive region 2 may be exposed to the etch composition for an extended period of time, thereby increasing the possibility that one or more of the layers will be damaged, contaminated or breached. In such instances, the initial yield and/or the reliability of the resulting devices may be degraded. After the remaining portions of the molding layer 4 and the insulating buffer layer 10 have been removed, the remaining structures, in particular the lower electrode of the capacitor, make be cleaned to remove residual etch composition and water, for example, a sequence of deionized water (DI) rinses to a target resistivity followed by processing in an isopropyl alcohol (IPA) dryer.

Another conventional method for fabricating OCS capacitors that can be used, for example, as the charge storage device in a DRAM memory cell, is illustrated in FIGS. 2A-2G. As in FIG. 1 and as again illustrated in FIG. 2A, a substrate is prepared with both insulating regions 1, for example, an interlayer oxide, and a conductive regions 2, such as a contact plug for establishing contact with conductive regions formed below the conductive regions.

A stop layer 3 may then be formed on both the insulating regions and conductive regions 2, with a molding layer 4, typically formed from an insulating material, for example, a silicon oxide, then being formed on the etch stop layer 3. The molding layer is then patterned and etched using a suitable photolithographic process (not shown) to remove the molding layer 4 and the stop layer 3 from regions of the substrate to form an opening 6 and thereby expose an upper surface of the conductive region 2. This opening 6 formed in the molding layer will, in turn, serve as the "mold" pattern for the subsequently formed capacitor structure. The photoresist pattern used as an etch mask (not shown) is then removed and the exposed surfaces cleaned in preparation for additional processing.

One or more layers of conductive material 7, 8, for example, a primary conductive layer may be combined with a barrier layer and/or an adhesion promoting layer in order to form a multilayer conductive stack structure having a desired combination of properties. One such combination of materials used for forming conductive material layers 7, 8 is a metal and the corresponding metal nitride. The conductive material layer(s) are formed on the exposed surfaces of the mold pattern structure including the upper surface of the remaining portions of the molding layer 4, the sidewalls of the opening 6 and the surface of the conductive region 2 exposed at the bottom of the opening. As illustrated in FIG. 2B, a photoresist buffer layer 14, for example, a novolak (also widely referred to as "novolac" in the art) resin-based photoresist, is then formed on the conductive material 7, 8 to a thickness sufficient to fill the opening 6. Through selection of an appropriate photoresist composition in combination with an appropriate application technique, the photoresist buffer layer 14 may be formed without incurring the voids associated with depositions of inorganic materials and illustrated in FIGS. 1B-1D, for example, CVD silicon oxide depositions, even in higher aspect ratio openings 6.

As illustrated in FIG. 2C, an upper portion 14a of the photoresist buffer layer 14 can then be removed by exposing the upper portion of the photoresist buffer layer to radiation having a combination of frequency and intensity that will tend to breakdown or depolymerize the upper portion 14a of the photoresist buffer layer 14 relative to the lower portion 14b of the buffer layer. This exposed portion of the photoresist buffer layer can then be removed by using a suitable developing solution, typically an alkaline solution for positive photoresist compositions. As illustrated in FIG. 2D, after removing the upper portion 14a of the photoresist buffer layer 14, a lower portion 14b of the photoresist buffer layer will remain in the opening 6 while upper portions of the conductive layers 7, 8 are exposed. The lower portion 14b of the photoresist buffer layer can then be baked or cured at a temperature and for a bake duration sufficient to harden the lower portion 14b in order to increase its resistance to the etch solutions used to remove the remaining portions of the molding layer 4.

As illustrated in FIG. 2E, any suitable blanket etch or CMP method may then be utilized to remove an upper portion(s) of the conductive material 7, 8 using any suitable method (or combination of methods) including, for example, blanket dry (plasma) etch-back or CMP processing, thereby leaving only those portions of the photoresist buffer layer 14 and the conductive material layers 7, 8 that were in the remaining portion of the opening 6.

As illustrated in FIG. 2F, the remaining portions of the molding layer 4 can then be removed with an appropriate etch, for example, a wet etch using a LAL etch composition, while the lower portion 14b of the photoresist buffer layer 14 serves as an etch mask to protect the lower portions of the conductive material layers 7, 8 and the underlying conductive region 2. As illustrated in FIG. 2G, the lower portion 14b of the photoresist buffer layer 14 may then be removed with a conventional ashing process during which the organic photoresist is exposed to a combination of elevated temperatures and/or activated oxygen species in order to "burn" the lower portion 14b of the resist out of the opening 6. The "ashed" substrate is then typically subjected to a clean-up process to remove residual photoresist and/or particulate contamination before the subsequent processing necessary to complete the capacitor structure.

This second conventional method, therefore, by reducing the likelihood of voids within the buffer material provided within the opening 6, improves the degree of protection afforded the conductive material layers 7, 8 from the etch composition(s) being used to remove the molding layer 4, thereby reducing the possibility that one or more of the layers will be damaged, contaminated or breached.

The conventional novolak photoresist compositions typically include three basic ingredients, specifically 1) a phenolic novolak resin, 2) a diazonaphthoquinone (DNQ) type dissolution inhibitor, and 3) an organic solvent. The novolak resin is utilized primarily for establishing the basic physical properties of the resulting photoresist film, for example, good film forming characteristics, etch resistance and thermal stability. The DNQ component, however, is utilized for modifying the relative dissolution rate of the exposed and unexposed regions of the novolak photoresist film in conventional alkaline developing solutions and allowing a useful photoresist pattern to be developed from the exposed photoresist film. The organic solvent(s) included in the photoresist composition are selected to provide appropriate viscosity control for the photoresist composition to allow the production of uniform, glassy thin photoresist films by, for example, spin coating techniques.

Novolak resins are soluble in a variety of common organic solvents including, for example, cyclohexanone, acetone, ethyl lactate, NMP (1-methyl-2-pyrrolidinone), diglyme (diethyleneglycol dimethyl ether), and PGMEA (propyleneglycol methyl ether acetate). Commercial photoresists are generally Formulated with polymer loadings of 15 to 30 weight percent with respect to the solvent content of the resist composition with the viscosity of the solution being adjusted by varying the polymer to solvent ratio of the composition, thereby allowing different photoresist compositions to be Formulated for generating a variety of film thicknesses.

The addition of DNQ inhibitors to novolak resins retards the dissolution rate of the photoresist film with an increasing concentration of the DNQ inhibitor(s) tending to further retard the dissolution rate. Upon exposure to radiation of appropriate frequency and intensity, however, the DNQ-novolak composition will tend to exhibit a dissolution rate greater than the dissolution rate of pure novolak resin. Conventional DNQ-novolak resists may have a DNQ inhibitor content of approximately 20 weight percent with respect to the weight of novolak resin, and can provide a differential dissolution rate of more than three orders of magnitude between the unexposed and exposed states. The nature of the interaction between the DNQ dissolution inhibitors and novolak resins is complex, but experimental evidence has suggested that hydrogen bonding of the inhibitor to the novolak resin plays an important role in inhibiting dissolution of the composition.

The developing solutions used for developing DNQ-novolak photoresist compositions are generally aqueous alkaline solutions. Although the earliest developing solutions used with DNQ-novolak resists were alkali metal hydroxide solutions, for example, dilute KOH or NaOH solutions, as the semiconductor industry has become more sensitive to metal contamination, the use of these metal containing developing solutions has decreased in favor of organic developers, for example, aqueous solutions of tetramethyl ammonium hydroxide (TMAH), typically at a concentration of between 0.2 and 0.3N.

The basic novolak resins include repeating phenol derivative monomer units that may be represented by, for example, the Formula:

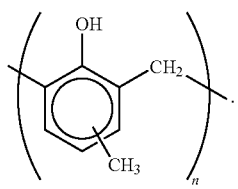

and may, in other instances, form complexes with the DNQ inhibitor compounds, for example, derivatives of 4- and 5-DNQ sulfonyl chlorides, with may be represented by, for example, the Formula (where r is a halogen):

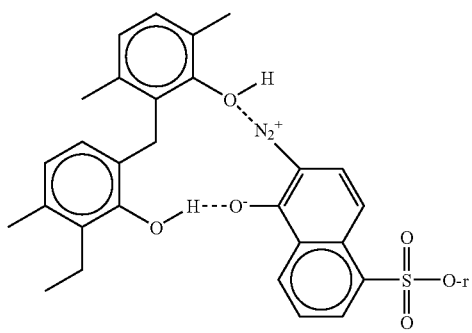

After the novolak photoresists have been developed and baked or otherwise cured or hardened, the residual portions of the photoresist film may be difficult to remove using conventional ashing processes, thereby increasing the processing time and expense and increasing the likelihood of incomplete removal that could compromise subsequent processing, functional yield and/or the reliability of the resulting devices. Without being bound by theory, it is believed that the prevalence of the C═C bonds in the phenol derivative backbone of the novolak polymer accounts for the film's resistance to conventional ashing processes.

As detailed above, the use of conventional inorganic materials for forming buffer layers, for example, silicon oxides that are formed by one or more CVD processes, tend to exhibit increasing void formation as the aspect ratio (depth/width) of the openings increases. See FIGS. 1A-1E and the corresponding description provided above. The use of conventional inorganic layers will also tend to increase the processing time as a result of the etch back and/or CMP processes necessary to remove the upper portion of the layers.

As also detailed above, the use of conventional novolak-based photoresist compositions for forming buffer layers requires the use of an exposure step in order to breakdown the polymers in the photoresist composition and/or modify their solubility to a degree that will allow them to be removed during a subsequent developing step. See FIGS. 2A-2G and the corresponding description provided above. Conventional novolak-based photoresist compositions are also typically subjected to a relatively high bake temperature on the order of 270° C. in order to harden the photoresist so that it is better suited to endure wet etch solutions without excessive dissolution and contamination of the wet etch bath equipment by the dissolving photoresist layer. This exposure step and the subsequent baking step will both involve additional handling, equipment and processing time, all of which will tend to increase the overall processing cost, the risk of handling induced damage and the overall processing time.

BRIEF SUMMARY OF THE INVENTION

As discussed above, the invention is directed to particular polymer compositions, photoresist compositions incorporating such polymer compositions and methods of fabricating semiconductor devices utilizing such photoresist and/or polymer compositions as a buffer layer. The invention is also directed to polymer compositions that, when used to form a buffer layer or pattern, can be more easily removed from the surface of a semiconductor substrate, thereby increasing productivity and/or reducing the likelihood of defects and failures associated with residual photoresist material.

Polymer compositions according to example embodiments of the invention include copolymers comprising from 61 to 75 weight percent benzyl methacrylate and from 8 to 15 weight percent alkyl acrylic acid with the balance being hydroxy alkyl methacrylate, including compositions in which the hydroxy alkyl methacrylate accounts for 17 to 24 weight percent. Polymer compositions according to example embodiments of the invention include copolymers having a mean molecular weight from 6700 to 7500 and a number mean molecular weight of 2600 to 3200. As suggested above, polymer compositions according to example embodiments of the invention include copolymers having at least three monomers and has a structure corresponding to Formula I below:

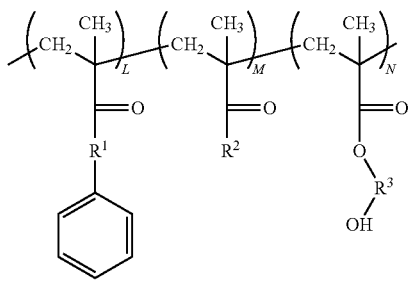

(I)

wherein the variables L, M and N represent the relative molar fractions of the monomers and satisfy the expressions $0<L\leq0.8$; $0<M\leq0.2$; $0<L\leq0.35$; and $L+M+N=1$ and further wherein $R^1$, $R^2$ and $R^3$ are independently selected from lower alkyls, e.g., $C_1$-$C_6$ alkyls, and particularly the $C_1$-$C_4$ alkyls and derivatives thereof.

The polymer compositions according to example embodiments of the invention include copolymers having a structure corresponding to Formula I wherein the variables L and M also satisfy the expressions $0.45\leq L\leq0.65$; and $0.15\leq M\leq0.25$. The polymer compositions according to example embodiments of the invention also include copolymers having a structure corresponding to Formula I wherein the variables L, M and N satisfy the expressions $0.45\leq L\leq0.65$; $0.15\leq M\leq0.25$ and $0.20\leq N\leq0.27$. The polymer compositions according to example embodiments of the invention also include copolymers having a structure corresponding to Formula I wherein the variables L, M and N satisfy the expressions $0.45\leq L\leq0.65$; $0.15\leq M\leq0.25$ and $0.17\leq N\leq0.25$. The polymer compositions according to example embodiments of the invention also include copolymers having a structure corresponding to Formula I wherein the variables L, M and N satisfy the expressions $0.45\leq L\leq0.65$ and $0.17\leq M\leq0.25$.

The polymer compositions according to example embodiments of the invention also include copolymers having a structure wherein the alkyl acrylic acid is selected from a group of consisting of the $C_1$-$C_4$ acrylic acids and mixtures thereof and the hydroxy alkyl methacrylate is selected from a group of consisting of the $C_1$-$C_4$ hydroxy alkyl methacrylates and mixtures thereof. The polymer compositions according to example embodiments of the invention also include copolymers having a structure wherein the alkyl acrylic acid includes a major portion of methyl acrylic acid and the hydroxy alkyl methacrylate includes a major portion of hydroxy ethyl methacrylate and those polymer compositions in which the alkyl acrylic acid consists essentially of methyl acrylic acid and the hydroxy alkyl methacrylate consists essentially of hydroxy ethyl methacrylate.

Example embodiments of the invention also encompass node separation polymer compositions comprising a copolymer having from 61 to 75 weight percent benzyl methacrylate and from 8 to 15 weight percent alkyl acrylic acid with the balance of the copolymer being hydroxy alkyl methacrylate; a cross-linking agent; a thermal acid generator; a surfactant; and a solvent. Example embodiments of the node separation polymer compositions also include those in which the copolymer has a mean molecular weight of 6700 to 7500, those in which the alkyl acrylic acid is selected from a group of consisting of the $C_1$-$C_4$ acrylic acids and mixtures thereof and the hydroxy alkyl methacrylate is selected from a group of consisting of the $C_1$-$C_4$ hydroxy alkyl methacrylates and mixtures thereof, those in which the alkyl acrylic acid includes a major portion of methyl acrylic acid and the hydroxy alkyl methacrylate includes a major portion of hydroxy ethyl methacrylate, and those in which the alkyl acrylic acid consists essentially of methyl acrylic acid and the hydroxy alkyl methacrylate consists essentially of hydroxy ethyl methacrylate.

Although those skilled in the art will appreciate that a variety of solvents or solvent systems may be incorporated in the node separation polymer compositions, it is expected that solvents selected from a group consisting of propylene glycol methyl ether, propylene glycol mono methyl ether acetate, ethylene glycol methyl ether, ethylene glycol methyl ether acetate, ethyl lactate, γ-butyrolactone, ethyl 3-ethoxypropionate, N-methyl-2-pyrrolidinone, dimethyl formamide, dimethyl acetamide, diethyl acetamide, dimethylsulfoxide, acetonitrile, carbitol acetate, dimethyl adipate or sulfolane and mixtures thereof will provide acceptable performance in most instances.

Example embodiments of the invention also encompass methods for protecting recessed regions comprising forming an insulating layer on a semiconductor substrate; forming an opening in the insulating layer; forming a protected layer on an upper surface of the insulating layer and a lower surface and sidewalls of the opening; forming a buffer layer on the protected layer, the buffer layer filling the recess and including a major portion of a copolymer having from 61 to 75 weight percent benzyl methacrylate; from 8 to 15 weight percent alkyl acrylic acid; with a balance being hydroxy alkyl methacrylate; removing an upper portion of the buffer layer using a developer solution to expose an upper portion of the protected layer, a remaining portion of the buffer layer substantially filling the recess; and removing the upper portion of the protected layer while a lower portion of the protect layer is protected by the remaining portion of the buffer layer. In some example embodiments of the method of protecting the balance of the copolymer may constitute from 17 to 24 weight percent. The copolymers according to example embodiments of the invention may have a mean molecular weight of, for example, 6700 to 7500 or, in another example embodiment, 6900 to 7200 and/or may have a number mean molecular weight of 2600 to 3200 or, in another embodiment 2800 to 3100. The polymers according to the example embodiments of the invention will be formed from at least three monomers that may be represented by the structure illustrated in Formula I above wherein the variables L, M and N represent the relative molar fractions of the monomers and satisfy the expressions $0<L\leq0.8$; $0<M\leq0.2$; $0<L\leq0.35$; and $L+M+N=1$ and wherein $R^1$, $R^2$ and $R^3$ are independently selected from $C_1$-$C_4$ alkyls and their derivatives. In some example embodiments the variables may also satisfy the expressions $0.45\leq L\leq0.65$ and $0.15\leq M\leq0.25$ and, in some instances $0.20\leq N\leq0.27$.

Additional example embodiments may utilize combinations that satisfy other expressions including, for example, $0.17\leq M\leq0.25$, include alkyl acrylic acids selected from a group of consisting of the $C_1$-$C_4$ acrylic acids and mixtures thereof; and/or hydroxy alkyl methacrylates selected from a group of consisting of the $C_1$-$C_4$ hydroxy alkyl methacrylates and mixtures thereof. Indeed, it is anticipated that methods according to these example embodiments of the invention may be practiced with any of the polymers and/or photoresist compositions described above.

As detailed below, example embodiments of the invention include methods of forming capacitors comprising forming an insulating layer on a semiconductor substrate; forming an opening in the insulating layer; forming a conductive layer on an upper surface of the insulating layer and a lower surface and sidewalls of the opening; forming a buffer layer on the conductive layer, the buffer layer filling the recess and including a major portion of a copolymer having from 61 to 75 weight percent benzyl methacrylate; from 8 to 15 weight percent alkyl acrylic acid; and with the balance of the copolymer being hydroxy alkyl methacrylate; removing an upper portion of the buffer layer using a developer solution to expose an upper portion of the conductive layer, a remaining portion of the buffer layer substantially filling the recess; and removing the upper portion of the conductive layer to separate lower electrode structures; removing the remaining portion of the buffer layer; forming a dielectric layer on the lower electrode structures; and forming an upper electrode on the dielectric layer. Again, it is anticipated that methods according to these example embodiments of the invention may be practiced with any of the polymers and/or photoresist compositions described above.

Example embodiments of the invention include methods of forming semiconductor devices comprising forming an electric element on a semiconductor substrate; forming an insulating layer on the electric element; forming an opening in the insulating layer to expose a contact region on the electric element; forming a conductive layer on an upper surface of the insulating layer and a lower surface and sidewalls of the opening; forming a buffer layer on the conductive layer, the buffer layer filling the recess and including a major portion of a copolymer having from 61 to 75 weight percent benzyl methacrylate; from 8 to 15 weight percent alkyl acrylic acid and with the balance or remainder of the copolymer being hydroxy alkyl methacrylate; removing an upper portion of the buffer layer using a developer solution to expose an upper portion of the conductive layer, a remaining portion of the buffer layer substantially filling the recess; removing the upper portion of the conductive layer to separate lower electrode structures; removing the remaining portion of the buffer layer; forming a dielectric layer on the lower electrode structures; and forming an upper electrode on the dielectric layer.

Developing solutions may be tailored to some degree to provide the desired dissolution rate, for example, an aqueous developer solution including from 1 to 5 wt % TMAH. The developing solution(s) may then be utilized for removing the upper portion of the buffer layer using a developer solution that maintains an average photoresist removal rate of at least 30 Å/second. When conventional ashing equipment and procedures are applied to a photoresist composition consistent with the invention described below, increased photoresist removal rates may be obtained relative to that experienced with conventional novolak-based photoresists. For example, compositions according to example embodiments of the invention may be removed at average removal rates of at least 150 Å/second or about five times the rate exhibited by conventional photoresist compositions under the same conditions.

BRIEF DESCRIPTION OF THE DRAWINGS

The invention will become more apparent by describing in detail example embodiments thereof with reference to the attached drawings in which:

FIGS. 4A through 4J are cross-sectional views illustrating a method of forming a semiconductor device that includes an OCS-type capacitor using a polymer resin composition and a method according to example embodiments of the invention;

Figure 1A:
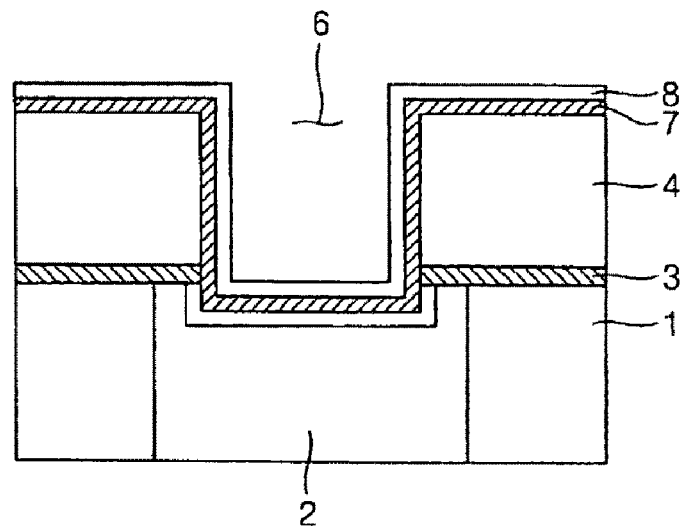
FIGS. 1A through 1E are cross-sectional views illustrating a conventional method of forming an OCS-type capacitor electrode using an oxide buffer layer.
Figure 1B:
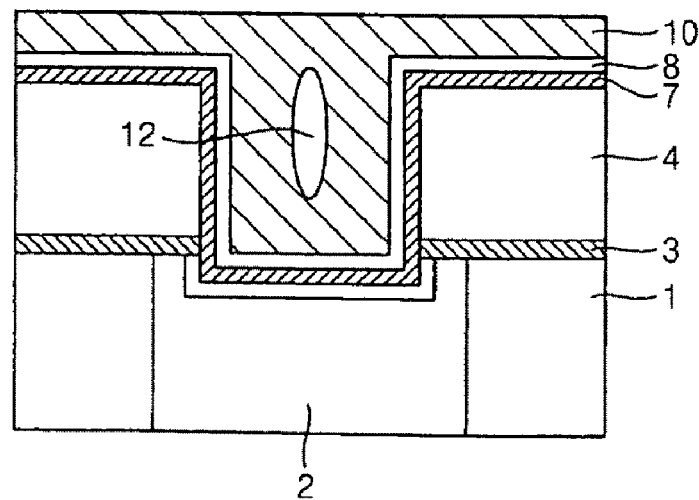
Figure 1C:
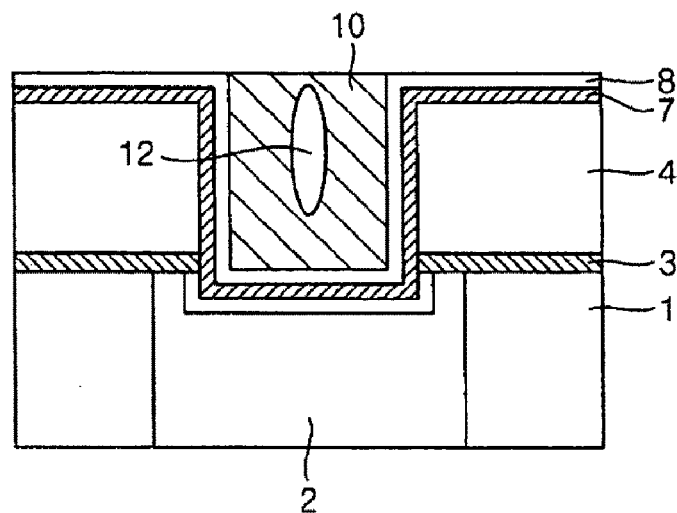
Figure 1D:
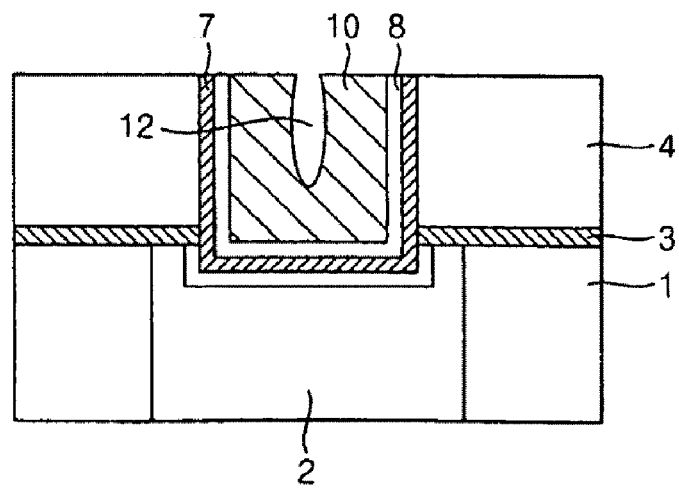
Figure 1E:
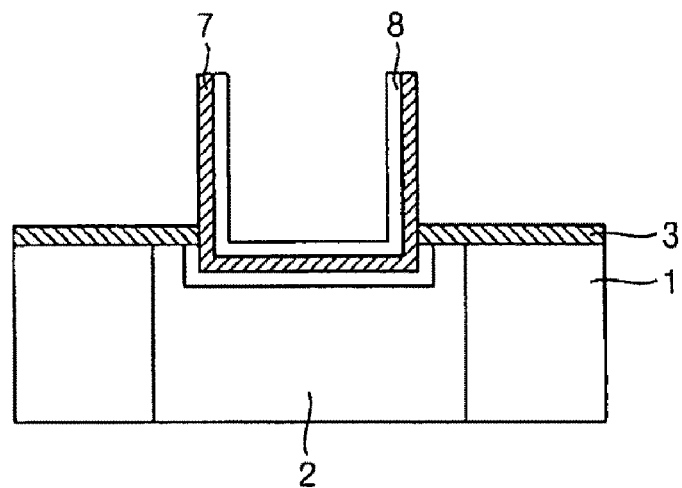
Figure 2A:
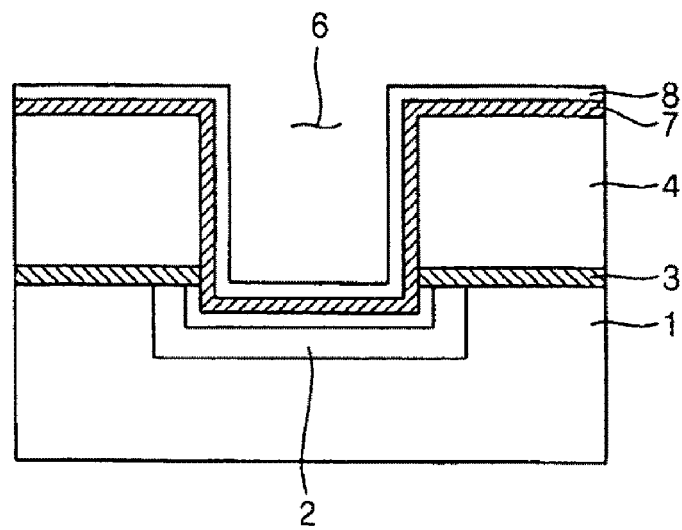
FIGS. 2A through 2G are cross-sectional views illustrating a conventional method of forming an OCS-type capacitor electrode using a conventional novolak-based photoresist to form a buffer layer.
Figure 2B:
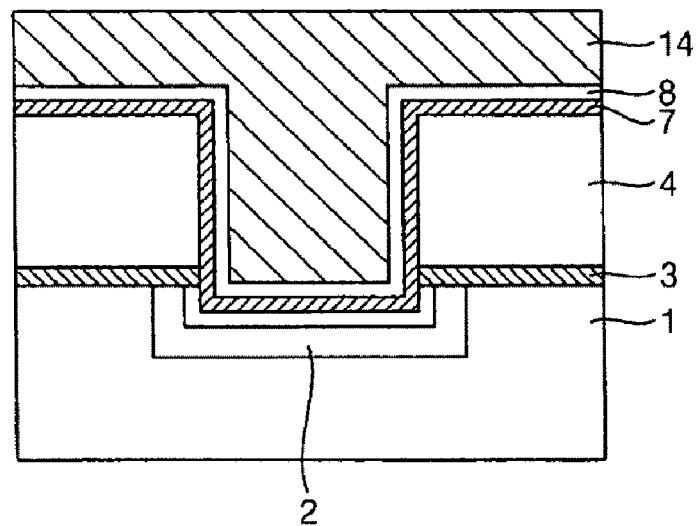
Figure 2C:
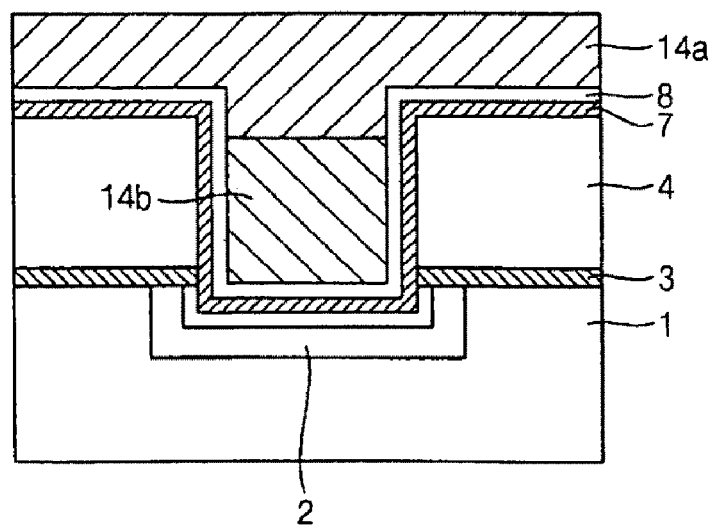
Figure 2D:
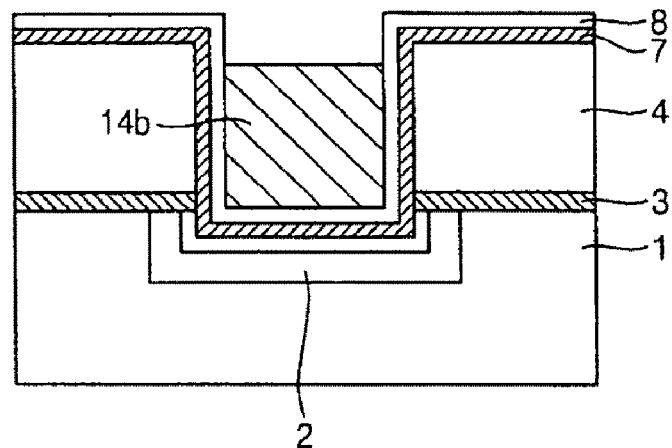
Figure 2E:
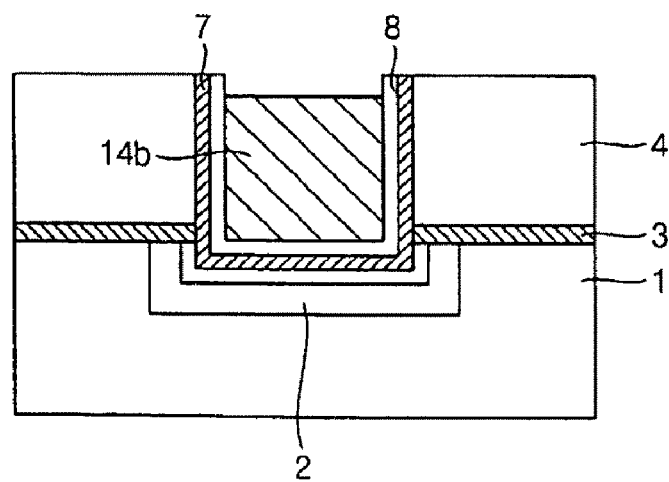
Figure 2F:
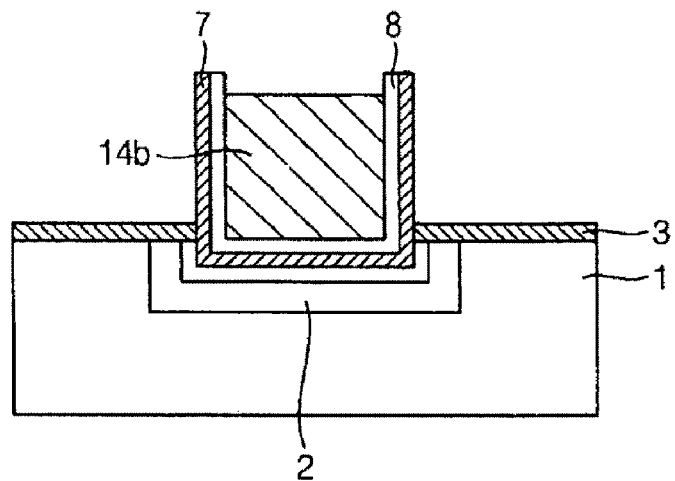
Figure 2G:
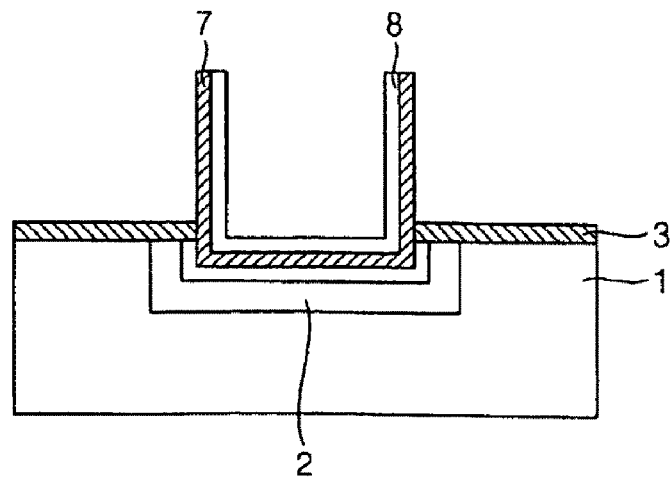

These drawings have been provided to assist in the understanding of the example embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity.

Those of ordinary skill will appreciate that certain of the various monomers, polymers, barrier coating compositions and barrier coating processes as illustrated or described with respect to the example embodiments may be selectively and independently modified and/or combined to create other monomers, polymers, barrier coating compositions and barrier coating processes useful for manufacturing semiconductor devices without departing from the scope and spirit of this disclosure.

DETAILED DESCRIPTION OF EXAMPLE EMBODIMENTS

Polymers according to the example embodiments of the invention may be generally represented by Formula I below:

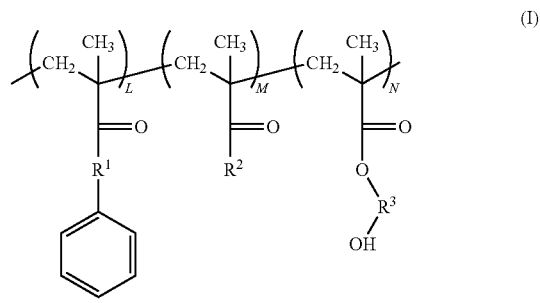

wherein the variables L, M and N represent the relative molar fractions of the monomers and satisfy the expressions $0<L\leq0.8$; $0<M\leq0.2$; $0<L\leq0.35$; and $L+M+N=1$ and further wherein $R^1$, $R^2$ and $R^3$ are independently selected from lower alkyls, e.g., $C_1$-$C_6$ alkyls, and particularly the $C_1$-$C_4$ alkyls, and derivatives thereof. The polymers according to the example embodiments of the invention will also exhibit a polystyrene conversion weight mean molecular weight of 6700 to 7500 and a number mean molecular weight of 2600 to 3200.

An example embodiment of a polymer including three monomers, i.e., a terpolymer, according to the invention is represented by the Formula II below:

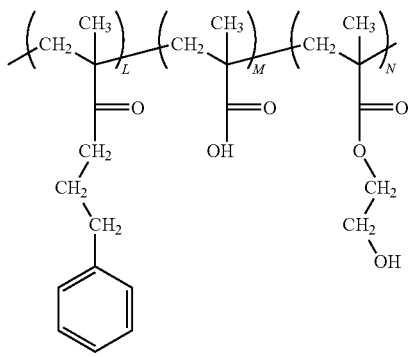

(II)

wherein the variables L, M and N again represent the relative molar fractions of the monomers and satisfy the expressions $0<L\leq0.8$; $0<M\leq0.2$; $0<L\leq0.35$; and $L+M+N=1$ and further wherein $R^1$, $R^2$ and $R^3$ are propyl, methyl and ethyl groups respectively.

Polymers according to the example embodiments of the invention may, in turn, be utilized in combination with other components, for example, one or more solvents, activators, inhibitors and/or viscosity modifiers to form polymer resin compositions according to other example embodiments of the invention. As will be addressed in more detail below, the dissolution rate of the polymer resin compositions according to the example embodiments of the invention tends to correlate to the proportion of the acrylic acid monomer incorporated in the polymer. Polymer resin compositions including as a primary component a polymer according to the example embodiments of the invention in which the proportion of the acrylic acid monomer is lower will tend to exhibit a correspondingly lower dissolution rate. For example, polymer resin compositions including less than 8 weight percent (all weight percents are with respect to the total weight of the polymer) methyl acrylic acid tend to exhibit dissolution rates of less than 30 Å/second while similar polymer resin compositions including at least 15 weight percent methyl acrylic acid tend to exhibit dissolution rates of at least 1000 Å/second.

A polymer according to the example embodiments of the invention, for example, as represented above in Formula II, may be polymerized from a mixture including 61 to 75 weight percent of a benzyl methacrylate monomer, 8 to 15 weight percent of a methyl acrylic acid monomer, for example, between 10 and 13 weight percent, and 17 to 24 weight percent of a hydroxy ethyl methacrylate monomer.

As will be appreciated, the relative weight percentages of the various classes of monomers may be adjusted as needed to satisfy the mathematical expressions noted above with respect to Formula I. Similarly, as will be appreciated, polymers according to the example embodiments of the invention may include more than one monomer from a particular class, for example, a mixture of hydroxy ethyl methacrylate and hydroxy propyl methacrylate monomers may be used as long as the various limitations and relationships noted above with respect to $R^3$ and N are still satisfied. Such combinations of closely related monomers may be useful for "fine-tuning" the performance of a polymer resin composition incorporating such polymers, for example, the dissolution rate of a layer formed from such a polymer resin composition.

As noted above, one or more polymers according to the example embodiments of the invention will typically be incorporated in polymer resin compositions according to other example embodiments of the invention for use in fabricating semiconductor devices. In such instances, the polymer(s) according to Formula I will typically comprise at least 50, and may exceed 90, weight percent of the polymer resin composition. Other components of the polymer resin composition will typically include 1 to 7 weight percent (typically 1.5 to 5 weight percent) of one or more cross-linking agents, for example, a melamine resin, 0.01 to 0.5 weight percent of one or more thermal acid generators (typically 0.03 to 0.2 weight percent), for example, paratoluene sulfonic acid pyridine salt, pyridine and mixtures thereof. The cross-linker and the thermal acid generator components act as agents for cross-bonding copolymers during a thermal process, i.e., baking process, used to harden the buffer layer. The polymer resin compositions according to example embodiments of the invention will also typically include 0.01 to 1 weight percent of one or more surfactants (typically 0.1 to 0.6 weight percent). The balance of the polymer resin composition will, in turn, be made up of an appropriate solvent or solvent system.

A variety of solvents may be utilized in the polymer resin composition including, for example, combination with other components, for example, one or more of propylene glycol methyl ether, propylene glycol mono methyl ether acetate, ethylene glycol methyl ether, ethylene glycol methyl ether acetate, ethyl lactate, γ-butyrolactone, ethyl 3-ethoxypropionate, N-methyl-2-pyrrolidinone, dimethyl formamide, dimethyl acetamide, diethyl acetamide, dimethylsulfoxide, acetonitrile, carbitol acetate, dimethyl adipate or sulfolane and mixtures thereof.

The polymer resin compositions according to the invention may coated on a substrate and then subjected to a low (or soft) bake (or curing) at no more than about 200° C. to form a buffer layer without requiring an exposure step as in the conventional processes for forming a buffer layer using photoresist. By controlling the relative fraction of the polymer attributed to the acrylic acid monomer(s), polymer resin compositions according to example embodiments of the invention can be provided with a dissolution rate that is controlled to be within a target range. Further, polymer resin compositions according to example embodiments of the invention will also tend to exhibit an increased removal rate under ashing relative to that achieved by conventional photoresists under identical or substantially identical conditions. Polymer resin compositions according to example embodiments of the invention will also tend to exhibit decreased solubility in solvents commonly used during semiconductor fabrication, for example, IPA and LAL solutions.

Figure 3A:
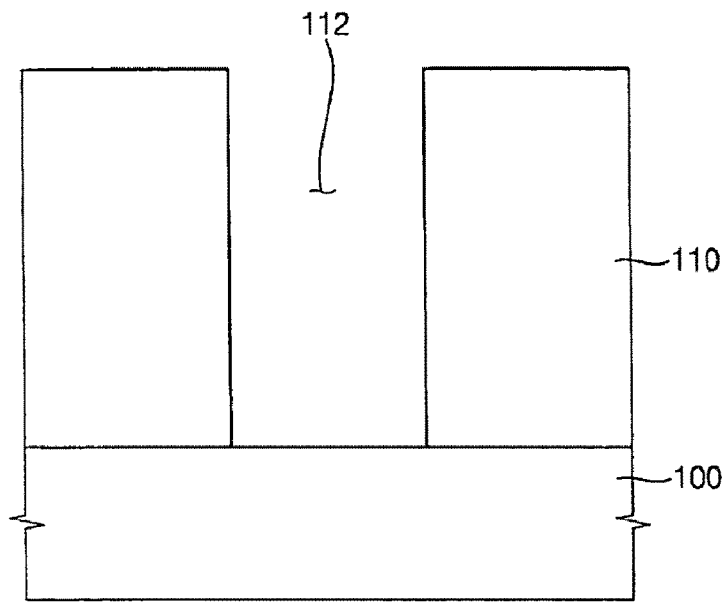
FIGS. 3A through 3F are cross-sectional views illustrating a method of forming an OCS-type capacitor electrode using a polymer resin composition and a method according to example embodiments of the invention.
Figure 3B:
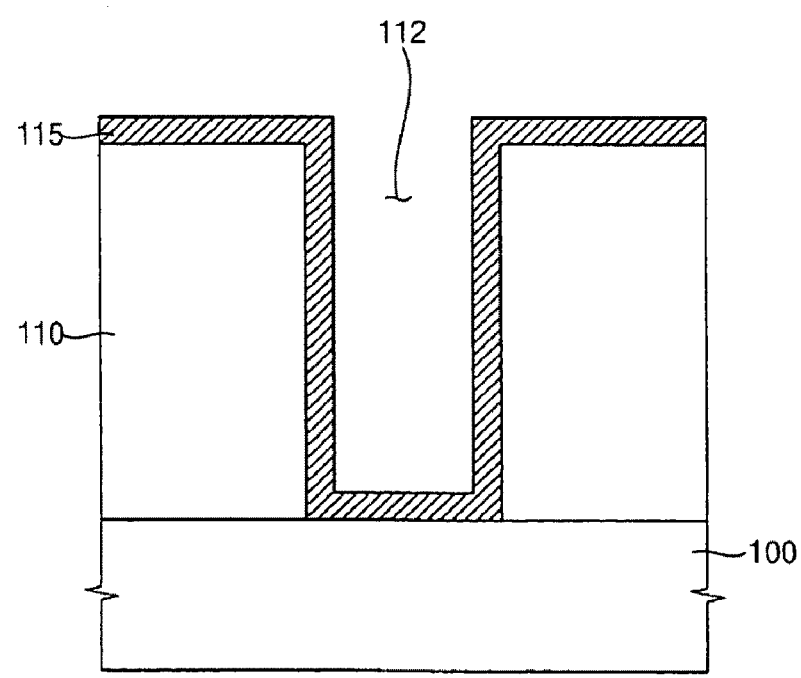

Polymer resin compositions according to example embodiments of the invention may be used to form buffer layers during the fabrication of OCS-type lower electrodes as illustrated in FIGS. 3A-3F. As illustrated in FIG. 3A, an oxide layer, specifically a mold oxide layer 110 is formed on a substrate 100. The mold oxide layer 110 is then patterned and etched to form an mold oxide pattern including opening 112 through which a portion of the surface of the substrate 100 is exposed.

As illustrated in FIG. 3A, a conductive layer 115 is then formed on the mold oxide pattern, including the sidewalls that define the opening 112 and the exposed surface of the substrate 100. The conductive layer 115 typically comprises at least one material selected from a group consisting of polysilicon, tungsten (W), titanium (Ti), titanium nitride (TiN) and tungsten nitride (WiN). For example, a multi-layer conductive layer 115 may be formed using a layer of a metal and a layer of the corresponding metal nitride to provide barrier layer and/or adhesion layer functionality, for example, a Ti/TiN stacked structure.

Figure 3C:
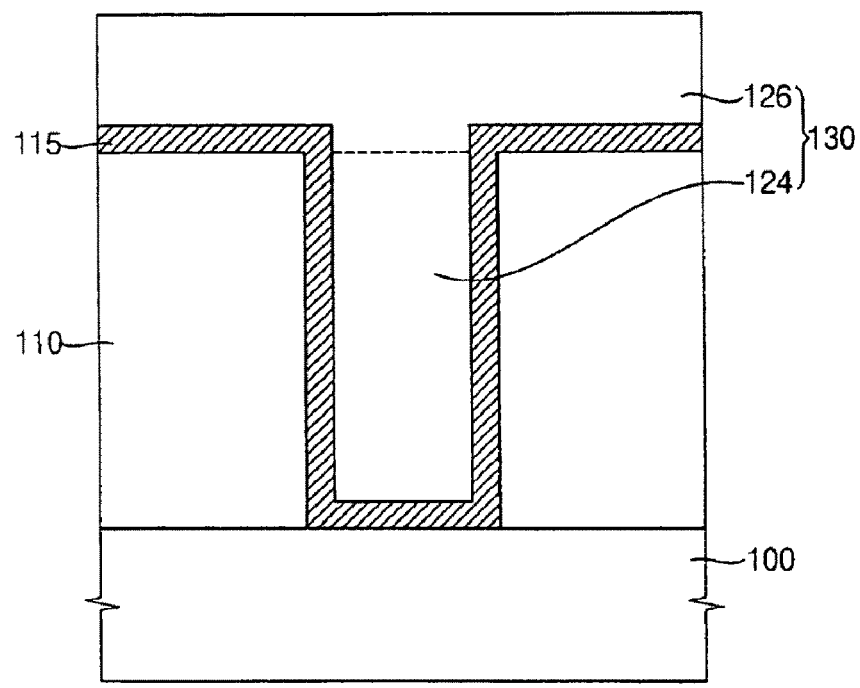

As illustrated in FIG. 3C, a buffer layer 130 is then formed using a polymer resin composition that is deposited to a thickness and under conditions sufficient to fill the opening 112 with the polymer resin composition and form an additional layer of the polymer resin composition across the exposed surface of the mold oxide pattern. The buffer oxide layer includes both an upper buffer layer region 126 and a lower buffer layer region 124. The buffer layer may be formed using any suitable application technique including, for example, conventional spin coating methods.

Figure 3D:
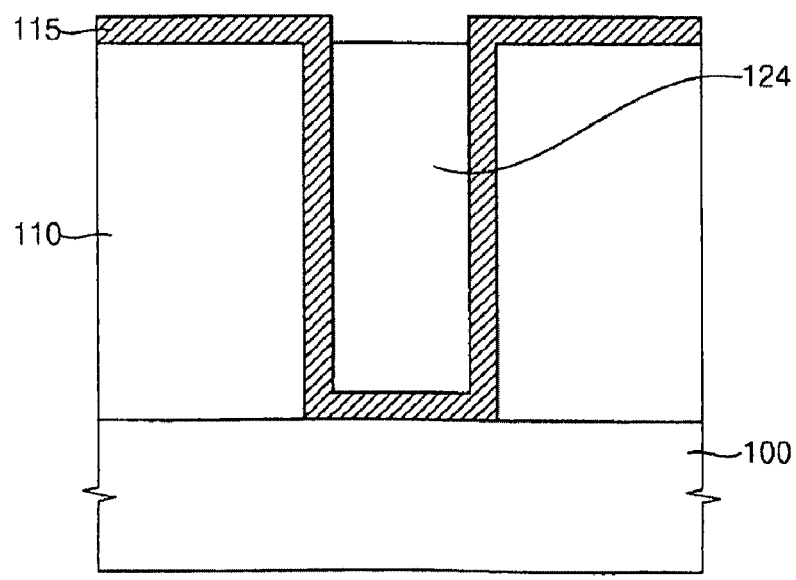

As illustrated in FIG. 3D, the upper buffer layer region 126 is then is removed using a conventional developing solution, for example, an aqueous solution of TMAH (tetramethyl ammonia hydroxide, typically at a concentration of 1.5 to 4 weight percent) with the balance of the solution being water and, optionally, additives such as pH adjuster(s), surfactant(s) and buffering agents. The remaining portion of the buffer layer, the lower buffer layer region 124 is then hardened by heating treatment (curing or baking) at a bake temperature of 150 to 200° C. for a period sufficient to form a hardened buffer layer pattern 125 by cross-bonding the copolymers in the polymer resin.

Figure 3E:
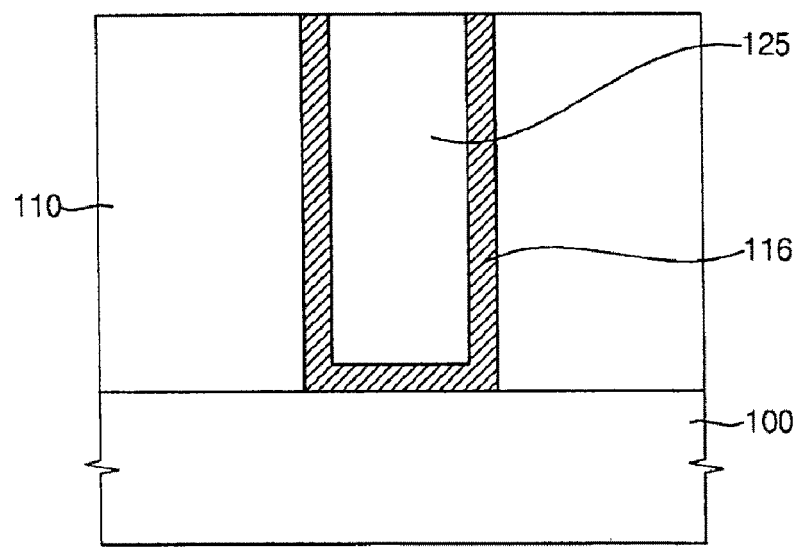
Figure 3F:
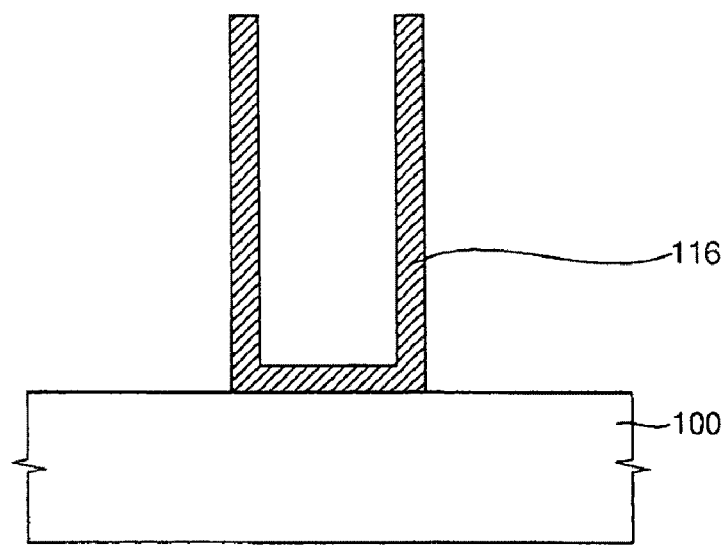

This hardened buffer layer pattern 125 will serve to protect the conductive layer 115 from damage during the conductive layer patterning step as depicted in FIG. 3E. In other words, the hardened buffer layer pattern 125 will not readily dissolve in solvents and wet etch compositions commonly found in a semiconductor processing environment including, for example, LAL solutions, isopropyl alcohol (IPA) and water.

A conductive pattern 116 is then formed by removing the upper portion of the conductive layer 115, particularly that portion of the conductive layer 115 found on the upper surface of the mold oxide pattern. The upper portion of the conductive layer 115 may be removed using an appropriate blanket etch using the hardened buffer layer pattern 125 as a etch mask or by using a conventional CMP process. As the upper surface of the mold oxide pattern is exposed the conductive pattern 116 is formed from the portions of the conductive layer 115 remaining in the openings 112. After removing the upper portion of the conductive layer 115, the substrate may be subjected to a cleaning step to remove etch residue and/or other debris from the exposed surfaces involving, for example, IPA and/or D.I. water.

The mold oxide pattern can then be removed using a conventional wet etch method, for example, using a LAL solution (water, HF and ammonium fluoride ($NH_4F$)), again using the hardened buffer pattern 125 as an etch mask to protect the conductive pattern 116 formed in the opening 112. The hardened buffer layer 125 can then be removed in an ashing step using an $O_2$ plasma method.

Without being bound by theory, it is believed that the buffer layers formed using a polymer resin composition according to the example embodiments of the invention are cross-bonded and includes a ring shaped hydrocarbon compound that comprises only about 5 to 20 weight percent of the resin composition. It is believed that this result is achieved by forming the hardened buffer layer 125 having a predominately methacrylate structure. Accordingly, and again without intending to be bound by speculation regarding the precise mechanism, it is believed that the hardened buffer layer 125 exhibits an enhanced etch rate (or material removal rate) under a conventional ashing process relative to a conventional photoresist, specifically photoresists based on novolak resin(s), that can be attributed to the reduction in the double bonds found in the base polymer. The ratio of the material removal rates for polymer resin compositions according to example embodiments of the invention and the material removal rates for conventional novolak resin based photoresists has been observed as being in the range of about 6:1.

Figure 4A:
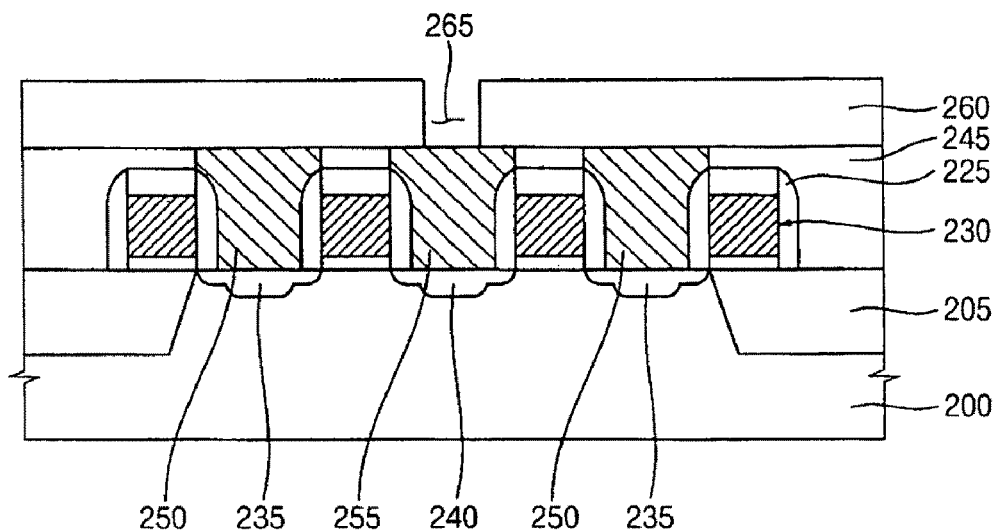
Figure 4B:
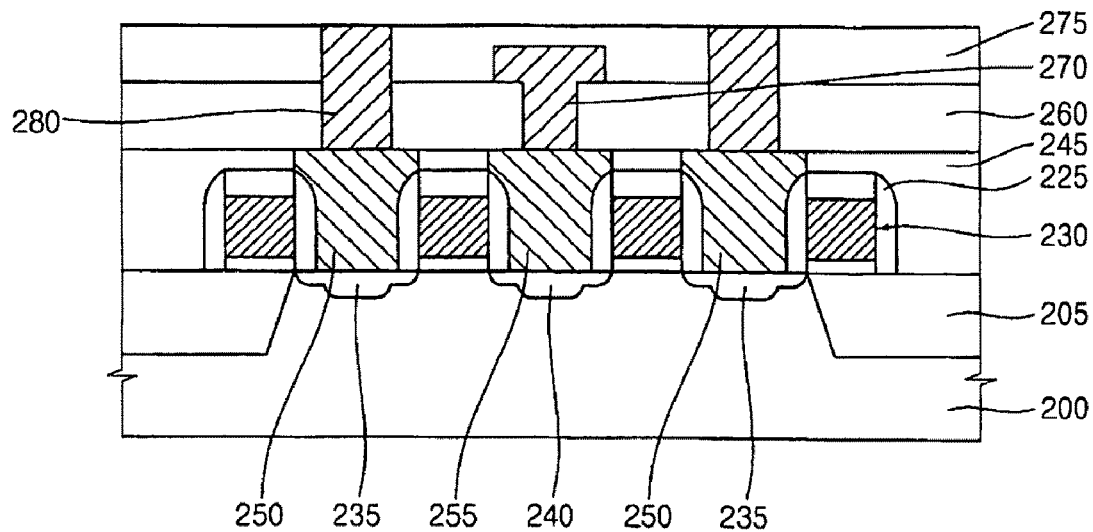

Polymer resin compositions according to example embodiments of the invention may be used to form buffer layers during the fabrication of semiconductor devices, for example, DRAMs, that include OCS-type lower electrodes as illustrated in FIGS. 4A-4J. As illustrated in FIGS. 4A and 4B, the semiconductor manufacturing process may remain conventional through the formation of active regions in a semiconductor substrate 200 using a shallow trench isolation pattern 205. Source regions 235 and drain regions 240 may then be formed in the active regions adjacent gate structures including a gate dielectric layer, a gate electrode 230 and gate spacers 225 adjacent opposite sides of the gate electrode. A first dielectric layer 245 can then be formed on the gate structures and a first pad pattern 250, 255 provided for establishing electrical contact to the source/drain regions 235, 240 respectively. A second dielectric layer 260 can then be formed and a bit line 270 formed in a contact hole 265 opened in the second dielectric layer 260 to provide electrical contact to the drain region 240 through the first pad pattern 250, 255. A third dielectric layer 275 can then be formed over the bit line 270 through which a second pad pattern 280 can be formed to provide electrical contact to the source regions 235.

Figure 4C:
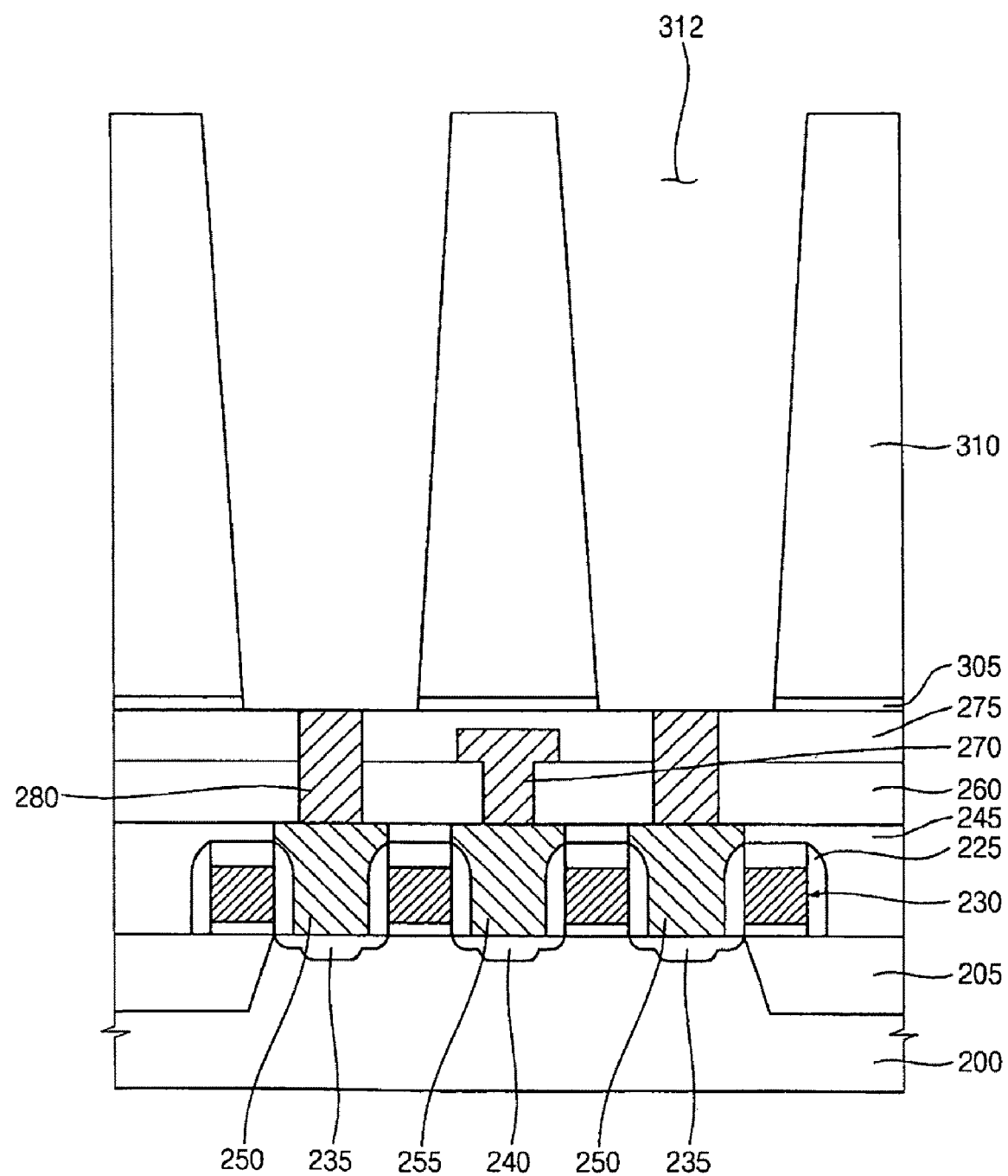

As illustrated in FIG. 4C, an etch stop layer 305 is then formed on the second pad pattern 280 and the exposed upper surface of the third dielectric layer 275. The etch stop layer 305 protects the second pad pattern 280 during the selective etch step used for etching the mold oxide layer to form the mold oxide pattern 310. The etch stop layer 305 typically comprises a nitride material or a metal oxide having a thickness sufficient to protect the underlying material from the oxide etch, for example, 10 to 200 Å, depending on the combination of the material, the etch chemistry and the relative thickness of the materials being etched and protected respectively.

As illustrated in FIG. 4C, the mold oxide pattern 310 includes openings 312 that may be formed using a conventional photolithographic process sequence of forming a resist pattern and then using that pattern as an etch mask during the subsequent oxide etch process. A portion of the etch stop layer 305 will be exposed by the opening 312 and may be removed using the oxide etch or by using an etch chemistry more suited to the material used to form the etch stop layer. When the exposed portion of the etch stop layer 305 is removed an upper surface of the second pad pattern 280 and, in this instance, a portion of the surrounding third dielectric layer 275.

Figure 4D:
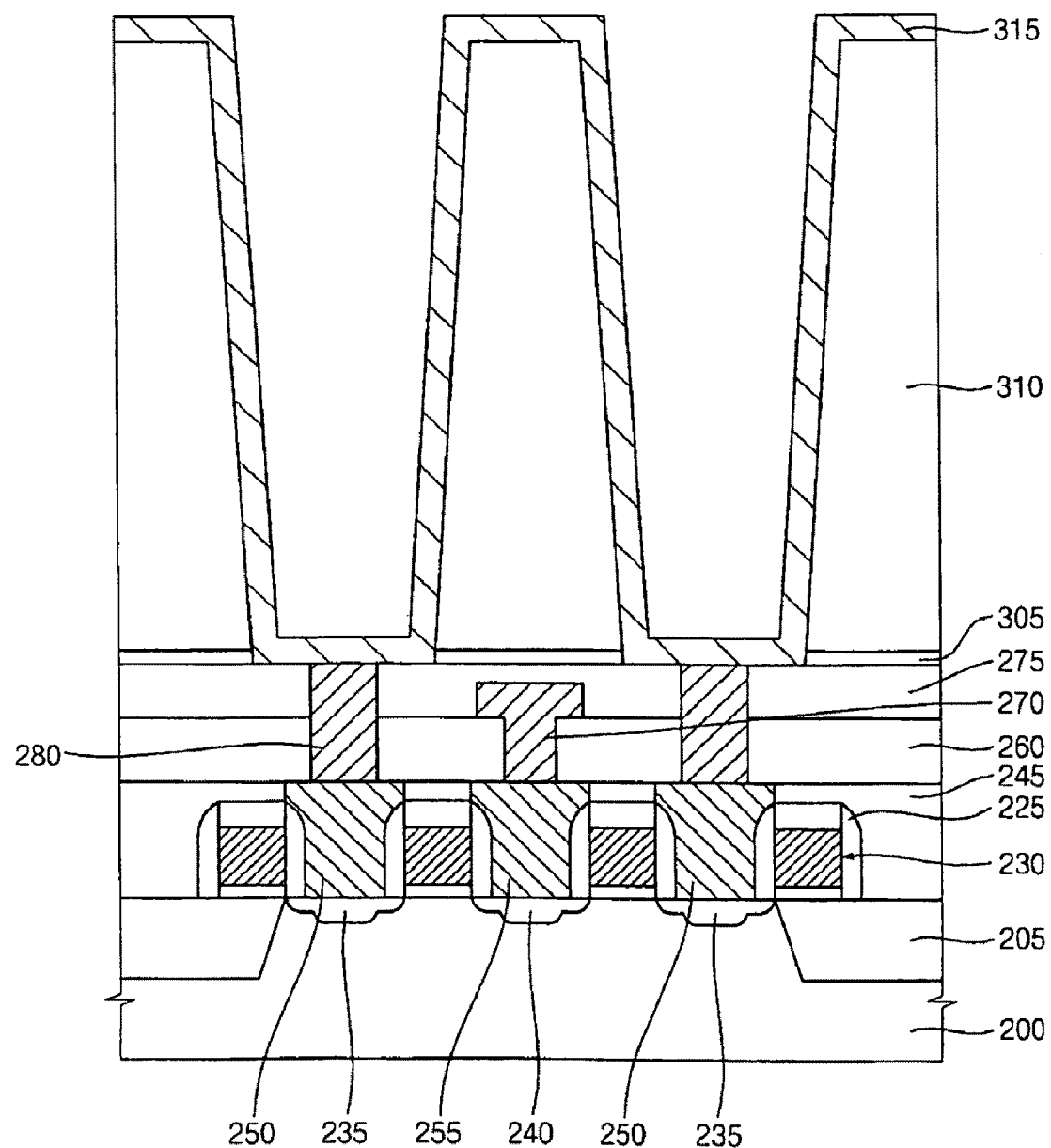

As illustrated in FIG. 4D, a conductive layer 315 that will be used to form a bottom electrode is formed on the mold oxide pattern 310 including all of the surfaces exposed within the opening 312. The conductive layer 315 may have a multi-layer structure including, for example, a stacked structure of titanium and titanium nitride films, having a thickness in the range of about 200 to 500 Å.

Figure 4E:
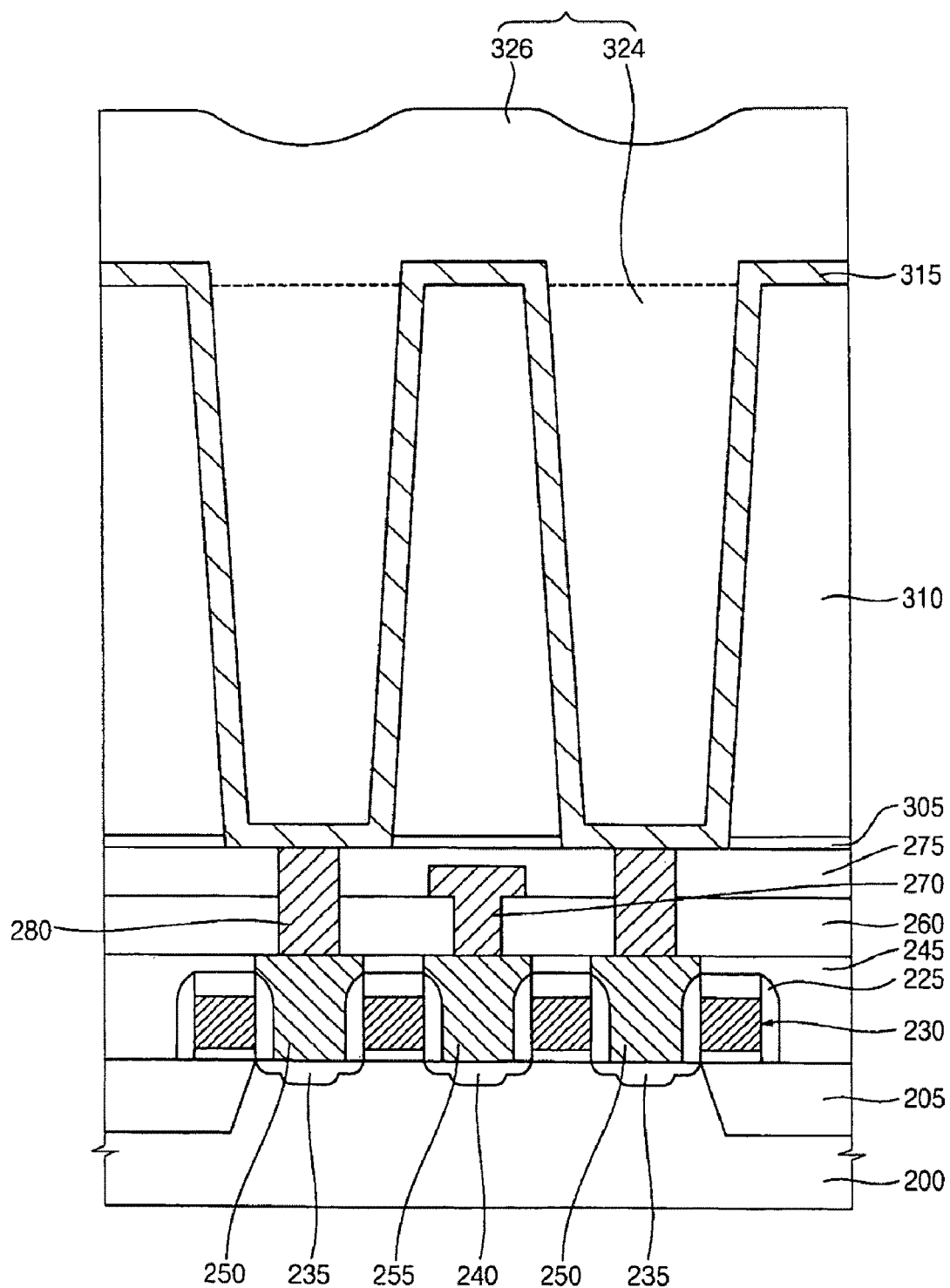
Figure 4F:
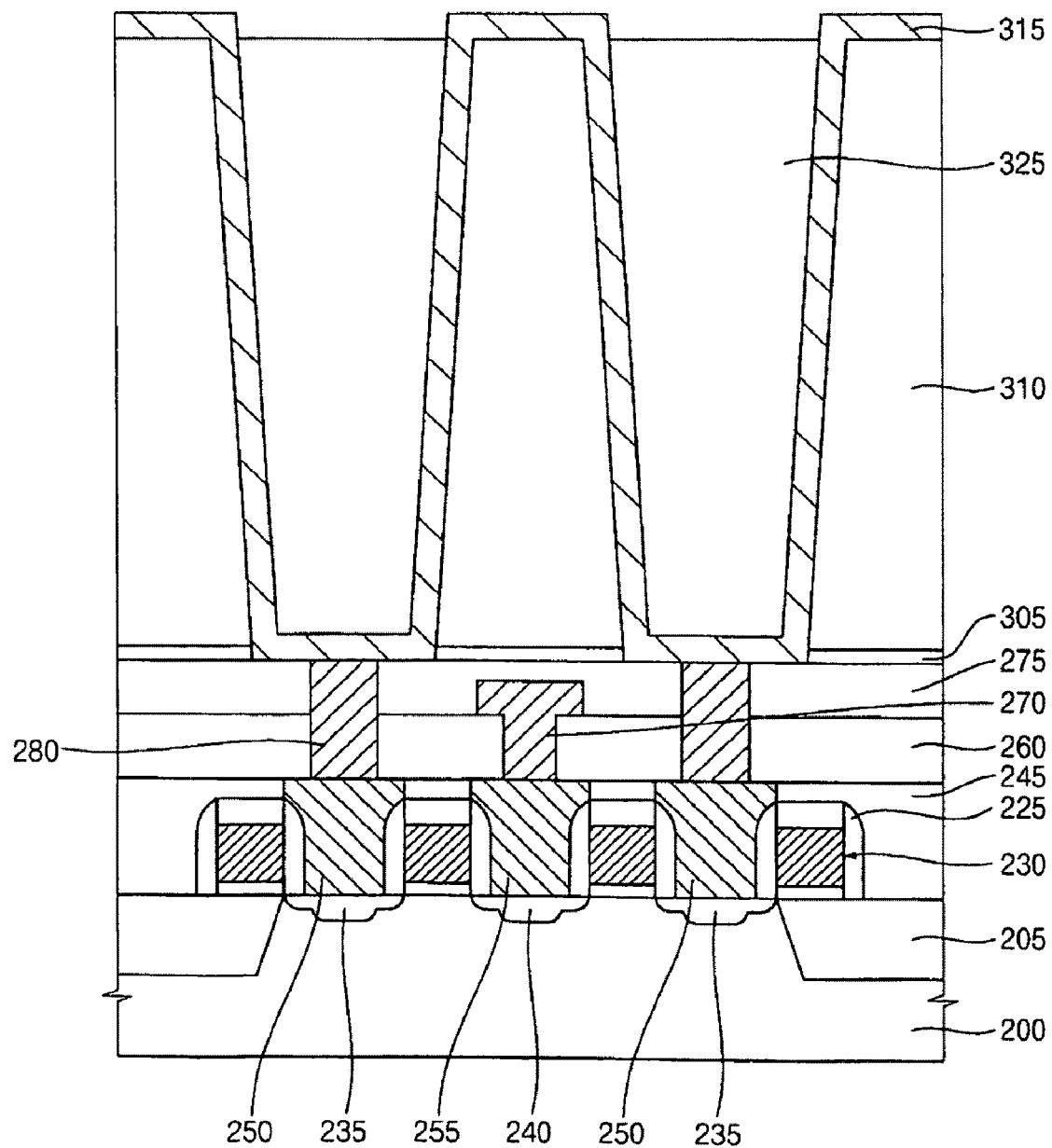

As illustrated in FIG. 4E, a buffer layer 330 may be formed on the conductive layer 315, using a polymer resin composition according to example embodiments of the invention, to a thickness sufficient to fill the opening 312. An upper portion 326 of the buffer layer 330 can then be removed from the substrate using a conventional developing solution comprising an aqueous tetramethyl ammonia hydroxide solution (typically 1.5 to 4 weight percent TMAH, for example 2.4 weight percent), leaving only the lower portion 324 of the buffer layer 330 on the substrate. The polymer(s) according to example embodiments of the invention remaining in the lower portion 324 of the buffer layer 330 is then cross-linked using a heat treatment (also referred to as a curing or bake step) at about 150 to 200° C. to harden the lower portion of the buffer layer as illustrated in FIG. 4F.

Figure 4G:
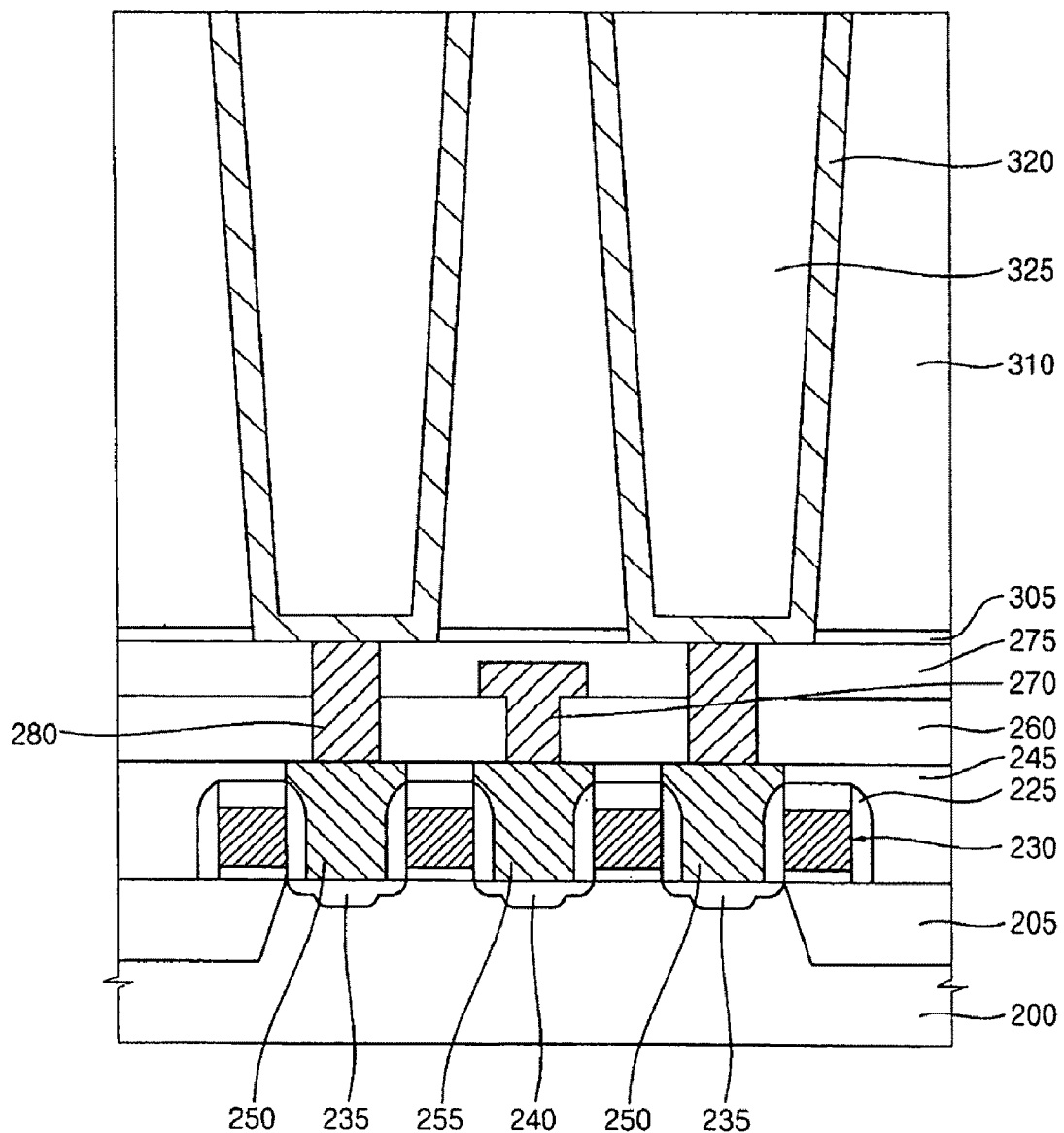

As illustrated in FIG. 4G, the upper portion of the conductive layer 315 is removed from the substrate using, for example, a conventional dry etch back process or CMP method to expose the top surface of the mold oxide pattern 310 and form a cylindrically-shaped bottom electrode 320. The substrate may then be cleaned to remove any etch residue remaining on the mold oxide pattern 310, the hardened buffer layer 325 or the bottom electrode 320. Conventional cleaning processes may use a combination of IPA or deionized (D.I.) water.

Figure 4H:
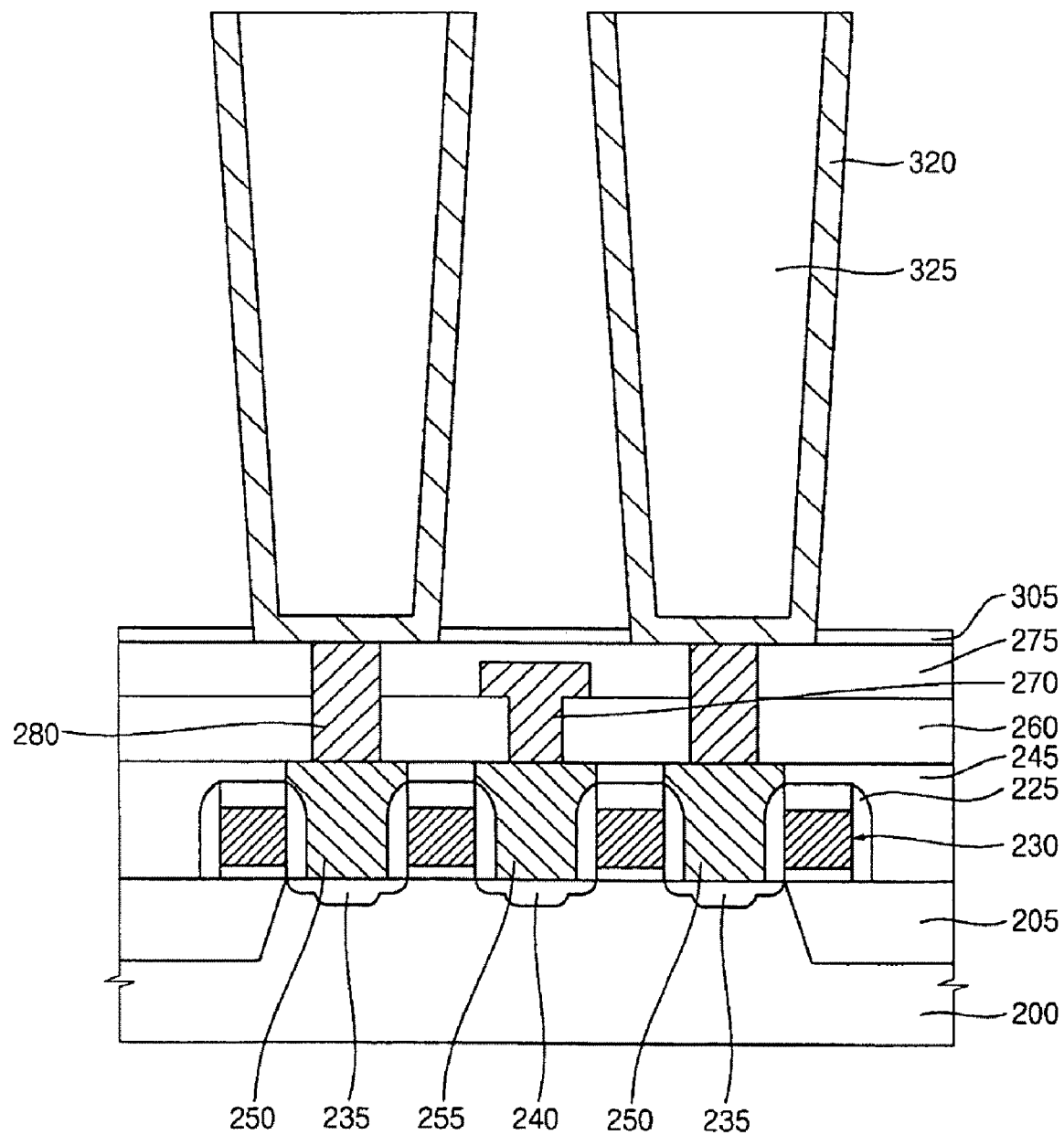
Figure 41:
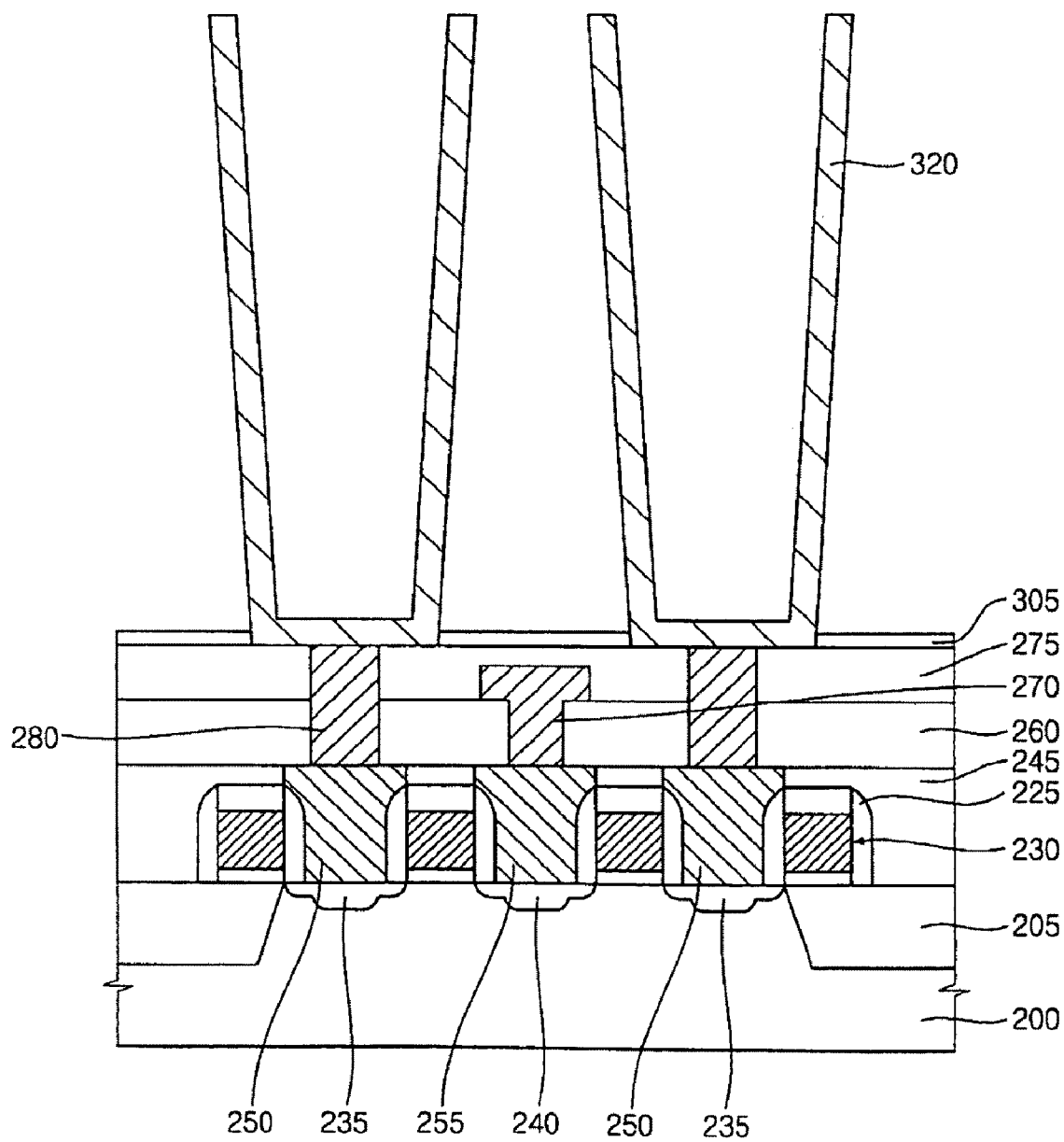
Figure 4J:
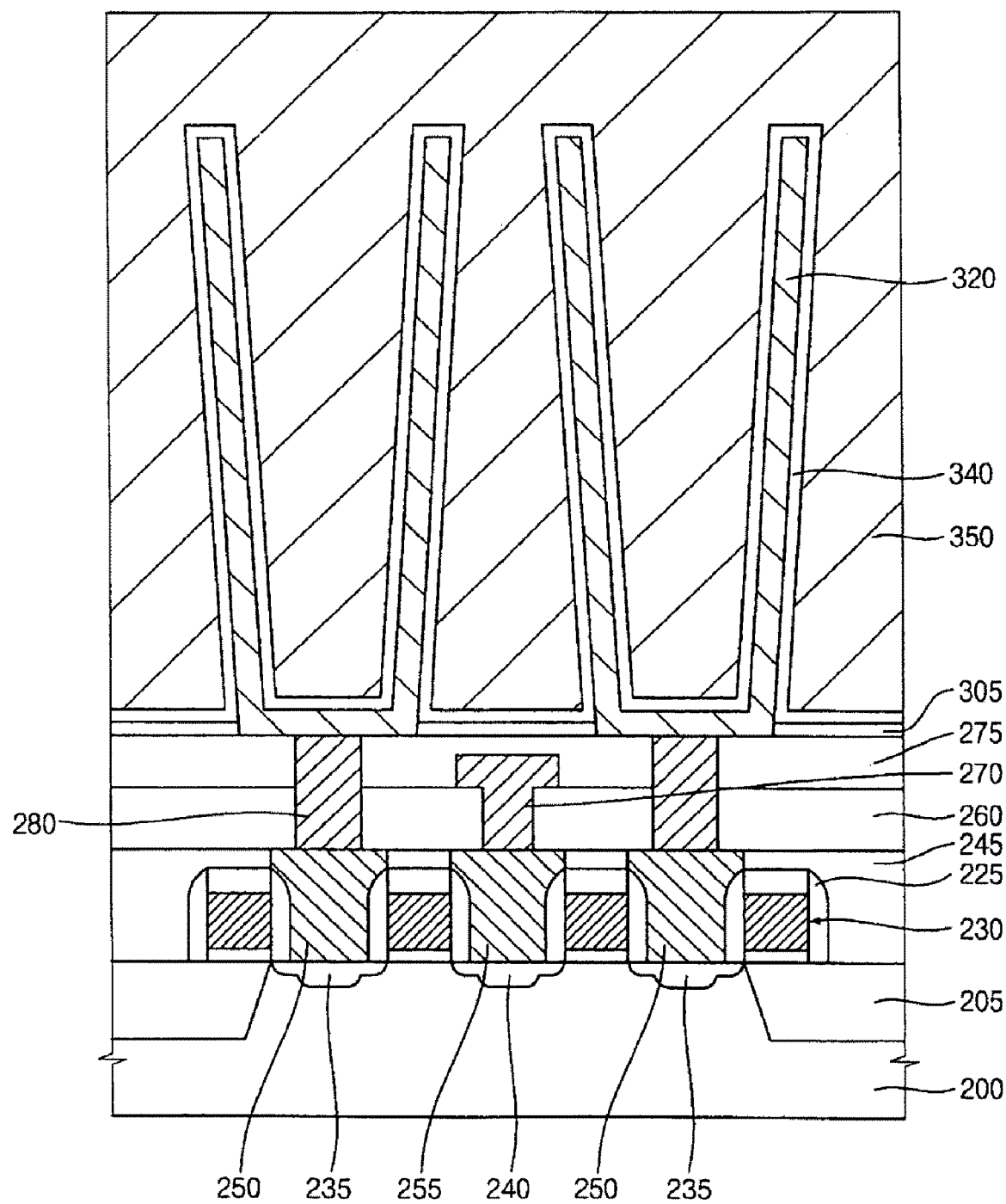
Figure 5:
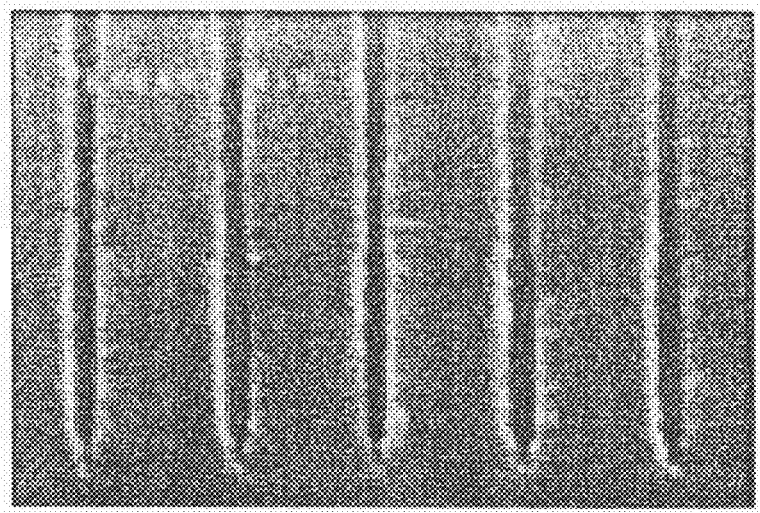
FIG. 5 illustrates a cross-sectional SEM image of lower electrodes that were fabricated using a polymer resin composition and a method according to example embodiments after the buffer layer has been removed by ashing.
Figure 6:
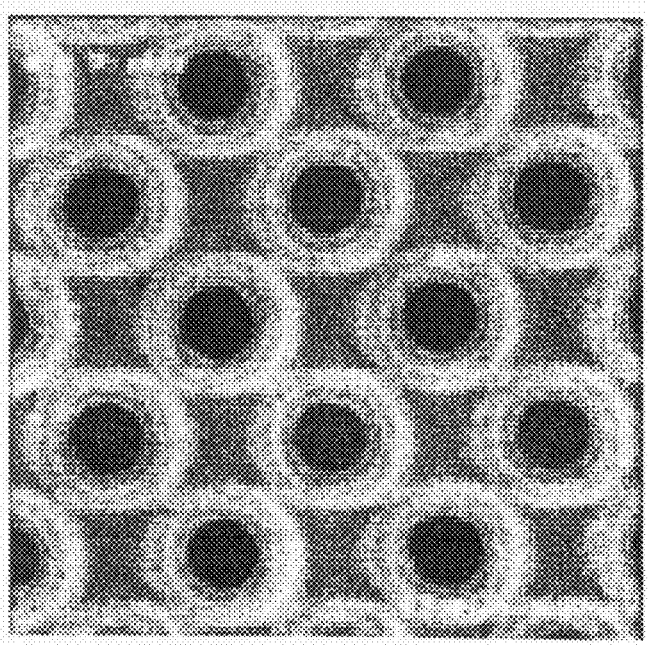
FIG. 6 illustrates a top-view SEM image of lower electrodes that were fabricated using a polymer resin composition and a method according to example embodiments after the buffer layer has been removed by ashing.

As illustrated in FIG. 4H, the mold oxide pattern 310 is then removed using, for example, a wet etch method using a LAL etch solution consisting of water, hydrogen fluoride and ammonium fluoride. The hardened buffer layer 325 may then be removed by ashing the substrate using an $O_2$ plasma to form the bottom electrode of the capacitor as illustrated in FIG. 4I. As noted above, the ashing duration necessary to clean the residual portions of the polymer resin composition is significantly less than that required for conventional photoresist, e.g., novolak resin based photoresists, removal, for example, an ashing time that is about 16-17% of that required for conventional photoresist compositions. As illustrated in FIG. 4J, a capacitor dielectric 340 and an upper electrode 350 can then be formed over the lower electrode 320 to complete the capacitor structure.

Example Embodiments of Polymers

Polymer—Example 1

A first polymer composition according to example embodiments of the invention was prepared by combining propylene glycol mono methyl ether acetate: 501.4 g, benzyl methacrylate: 152 g; 2-hydroxy ethyl acrylate: 43.7 g; methyl acrylic acid: 22.96 g; and dimethyl-2,2'-azobis(2-methylpropionate: 40.5 g.

This mixture was then reacted for 1-3 hours at 80° C., and then apparently stirred for 4-5 hours, to obtain a polymer having a polystyrene conversion weight mean molecular weight of 7100 and a number mean molecular weight of 2900. The methyl acrylic acid content of the copolymer was 10.5 weight percent.

Polymer—Example 2

A second polymer according to example embodiments of the invention was prepared by combining propylene glycol mono methyl ether acetate: 501.4 g, benzyl methacrylate: 150.9 g, 2-hydroxy ethyl acrylate: 43.7 g, methyl acrylic acid: 24.1 g, dimethyl-2,2'-azobis(2-methylpropionate): 40.5 g.

The mixture was then reacted for 1-3 hours at 80° C. and then stirred for 4-5 hours, to obtain a polymer exhibiting a polystyrene conversion weight mean molecular weight of 7000, a number mean molecular weight of 2900, and the methyl acrylic acid content of the copolymer was 11 weight percent.

Polymer—Example 3

A third polymer according to example embodiments of the invention was prepared by combining propylene glycol mono methyl ether acetate: 501.4 g; benzyl methacrylate: 149.8 g; 2-hydroxy ethyl acrylate: 43.7 g; methyl acrylic acid: 25.1 g, α-methylstyrene dimer: 25.15 g; and dimethyl-2,2'-azobis(2-methylpropionate: 40.5 g.

This mixture was then treated for 1 to 3 hours at 80° C. and stirred for 4 to 5 hours to obtain a copolymer having a polystyrene conversion weight mean molecular weight of 7000 and a number mean molecular weight of 2900. The methyl acrylic acid content of the copolymer was 11.5 weight percent.

Polymer—Example 4

A fourth polymer according to example embodiments of the invention was prepared by combining propylene glycol mono methyl ether acetate: 501.4 g; benzyl methacrylate: 152 g; 2-hydroxy ethyl acrylate: 43.7 g; methyl acrylic acid: 21.74 g, α-methylstyrene dimer: 25.15 g; and dimethyl-2,2'-azobis (2-methylpropionate: 40.5 g.

This mixture was then treated for 1 to 3 hours at 80° C. and stirred for 4 to 5 hours to obtain a copolymer having a polystyrene conversion weight mean molecular weight of 7100 and a number mean molecular weight of 2900. The methyl acrylic acid content of the copolymer was 10 weight percent.

Polymer—Example 5

A fifth polymer according to example embodiments of the invention was prepared by combining propylene glycol mono methyl ether acetate: 501.4 g; benzyl methacrylate: 149.8 g; 2-hydroxy ethyl acrylate: 43.7 g; methyl acrylic acid: 26.7 g, α-methylstyrene dimer: 25.15 g; and dimethyl-2,2'-azobis(2-methylpropionate: 40.5 g.

This mixture was then reacted for 1-3 hours at 80° C. and stirred for 4-5 hours to obtain a copolymer having a polystyrene conversion weight mean molecular weight of 7050 and a number mean molecular weight of 2850. The methyl acrylic acid content of the copolymer was 12 weight percent.

Example Embodiments of Polymer Resin Compositions

Node Separation Polymer—Example 6

A node separation polymer (NSP) according to example embodiments of the invention was prepared by combining the copolymer prepared in Example 1: 1:83 g; melamine resin: 2.88 g; paratoluene sulfonic acid pyridine salt: 0.04 g; pyridine: 0.04 g; surfactant: 0.28 g; propylene glycol mono methyl ether acetate: 10.05 g.

Node Separation Polymer—Example 7

A node separation polymer (NSP) according to example embodiments of the invention was prepared by combining the copolymer prepared in Example 2: 42 g; melamine type resin: 2.88 g; paratoluene sulfonic acid pyridine salt: 0.04 g; pyridine: 0.04 g; surfactant: 0.28 g; and propylene glycol mono methyl ether acetate: 10.05 g.

Node Separation Polymer—Example 8

A node separation polymer (NSP) according to example embodiments of the invention was prepared by combining the copolymer prepared in Example 2: 83 g; melamine type resin:

2.88 g; paratoluene sulfonic acid pyridine salt: 0.04 g; pyridine: 0.04 g; surfactant: 0.28 g; propylene glycol mono methyl ether acetate: 10.05 g.

Node Separation Polymer—Example 9

A node separation polymer (NSP) according to example embodiments of the invention was prepared by combining the copolymer prepared in Example 2: 42 g, copolymer of the composition example 3: 42 g; melamine resin: 2.88 g; paratoluene sulfonic acid pyridine salt: 0.04 g; pyridine: 0.04 g; surfactant: 0.28 g, propylene glycol mono methyl ether acetate: 10.05 g.

Node Separation Polymer—Example 10

A node separation polymer (NSP) according to example embodiments of the invention was prepared by combining the copolymer prepared in Example 3: 83 g; melamine resin: 2.88 g; paratoluene sulfonic acid pyridine salt: 0.04 g; pyridine: 0.04 g; surfactant: 0.28 g; and propylene glycol mono methyl ether acetate: 10.05 g.

Node Separation Polymer—Example 11

A node separation polymer (NSP) according to example embodiments of the invention was prepared by combining the copolymer prepared in Example 4: 83 g; melamine resin: 2.88 g; paratoluene sulfonic acid pyridine salt: 0.04 g; pyridine: 0.04 g; surfactant: 0.28 g; and propylene glycol mono methyl ether acetate: 10.05 g.

Node Separation Polymer—Example 12

A node separation polymer (NSP) according to example embodiments of the invention was prepared by combining the copolymer prepared in Example 5: 83 g, melamine resin: 2.88 g; paratoluene sulfonic acid pyridine salt: 0.04 g; pyridine: 0.04 g; surfactant: 0.28 g; propylene glycol mono methyl ether acetate: 10.05 g.

Node Separation Polymer

Comparative Example 1

A comparative example was prepared using a phenol novolak resin: 25 g, melamine resin: 2.88 g; paratoluene sulfonic acid pyridine salt: 0.04 g; pyridine: 0.04 g; surfactant: 0.28 g; propylene glycol mono methyl ether acetate: 68.05 g.

Using certain of the example embodiments of the invention previously produced, a series of tests were conducted to evaluate the performance and significance of the polymers and compositions described above.

Dissolution Rate Evaluation of Polymer Resin According to MAA Content

The significance of the acrylic acid component to the dissolution rate of the resulting polymer resin compositions was then evaluated using various of the node separation polymers. Substrates were coated and then "developed" using the same developing composition in order to compare the relative performance of the two competing polymers. The results of this evaluation are reflected below in TABLE 1.

TABLE 1

| Methyl Acrylic Acid (wt %) | 10% | 11% | 12% |
|---|---|---|---|
| Dissolution Rate | 37.7 Å/sec | 283.2 Å/sec | 774.6 Å/sec |

As reflected in the data above, the polymer resin compositions according to example embodiments of the invention reflect a strong dependence on the concentration of MAA present within the film. For example, a 20% increase in the relative MAA concentration from 10% to 12% translated into a 20× increase in the dissolution rate for the composition having the higher MAA concentration.

Evaluation of Dissolution Rates Re MAA Concentration

The significance of the acrylic acid component to the dissolution rate of the resulting polymer resin compositions was further evaluated using various of the node separation polymers. Substrates were coated and then "developed" using the same developing composition in order to compare the relative performance of the two competing polymers with respect to node separation polymers. The results of this evaluation are reflected below in TABLE 2.

TABLE 2

|  | Ex. 1 | Ex. 3 | Ex. 5 | Ex. 6 | Ex. 7 |
|---|---|---|---|---|---|
| MAA (wt %) | 10.5% | 11% | 11.5% | 10% | 12% |
| Buffer layer removed | 6270 Å | 11330 Å | 20555 Å | 1429 Å | 30895 Å |
| Dissolution Rate | 157 (Å/S) | 283 (Å/S) | 514 (Å/S) | 35 (Å/S) | 772 (Å/S) |

The polymer resin buffer layers according to experimental example 1, 3, 5-7 are respectively coated on the mold oxide pattern that included a number of openings in the substrate to a thickness of about 45,000 Å. After measuring, these buffer layers were then exposed to a developing solution including 2.4 weight percent of TMAH for about 40 seconds. The remaining portion of the polymer resist composition was then measured to determine how much of the original layer had be removed or scrambled.

Solubility Evaluation of Example Buffer Layers

TABLE 3

| Polymer resin composition | Ex. 1 | Ex. 2 | Ex. 3 | Ex. 4 | Ex. 5 | Ex. 6 | Ex. 7 | Comparative example |
|---|---|---|---|---|---|---|---|---|
| Surface uniformity & Thickness variation | N | N | N | N | N | N | N | Y |
| Soluble in IPA? | N | N | N | N | N | N | N | Y |

The significance of the acrylic acid component to the dissolution rate of the resulting polymer resin compositions was further evaluated using various ones of the node separation polymers prepared as noted in Examples 1-7. Substrates were coated and then "developed" using the same developing composition in order to compare the relative performance of the competing polymers with respect to node separation polymers.

The test substrates were coated with the various experimental and comparative compositions noted above. In light of the data provided above, the rate of dissolution was taken into account when setting the development period to ensure that a polymeric buffer layer having a thickness of about 20,000 Å and then hardened. The polymer resin compositions according to experimental Examples 1-7 and the comparative example were then evaluated. None of the conventional etch and cleaning steps appear to have much of an impact on the hardened polymer resin composition, e.g., very little, if any, of the hardened composition was removed during exposure to an LAL solution comprising D.I. water, hydrogen fluoride and ammonium fluoride and/or drying steps utilizing IPA.

As reflected above in TABLE 3, the quality of the polymer resin buffer layers prepared from compositions corresponding to experimental examples 1-7 do not exhibit any significant variations of layer quality. In particular, the buffer layers prepared from compositions corresponding to experimental examples 1-7 exhibit good film qualities, i.e., does not reflect any significant variations in layer thickness post-development.

While the invention has been particularly shown and described with reference to certain example embodiments thereof, it will be understood by those of ordinary skill in the art that various changes in form and details may be made therein without departing from the spirit and scope of the invention as defined by the following claims.

We claim:

1. A method of forming a capacitor comprising:
forming an insulating layer on a semiconductor substrate;
forming an opening in the insulating layer;
forming a conductive layer on an upper surface of the insulating layer and a lower surface and sidewalls of the opening;
forming a buffer layer on the conductive layer, the buffer layer filling the opening and including a major portion of a copolymer having from 61 to 75 weight percent benzyl methacrylate; from 8 to 15 weight percent alkyl acrylic acid; and with a remainder being hydroxy alkyl methacrylate;
removing an upper portion of the buffer layer using a developer solution to expose an upper portion of the conductive layer, a lower portion of the buffer layer substantially filling the opening;
removing the upper portion of the conductive layer to separate lower electrode structures;
removing the lower portion of the buffer layer;
forming a dielectric layer on the lower electrode structures; and
forming an upper electrode on the dielectric layer.

2. The method of forming a capacitor according to claim 1, wherein:
the remainder is from 17 to 24 weight percent.

3. The method of forming a capacitor according to claim 1, wherein:
the copolymer has a mean molecular weight of 6700 to 7500.

4. The method of forming a capacitor according to claim 1, wherein:
the copolymer includes at least three monomers and has a structure corresponding to Formula I:

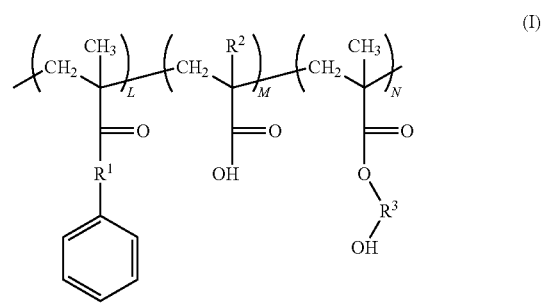

wherein the variables L, M and N represent the relative molar fractions of the monomers and satisfy the expressions $0 < L \leq 0.8;$ $0 < M \leq 0.25;$ $0 < N \leq 0.35;$ and $L + M + N = 1;$ and, wherein $R^1$, $R^2$ and $R^3$ are independently selected from $C_1$-$C_6$ alkyls and derivatives thereof.

5. The method of forming a capacitor according to claim 4, wherein:
the variables L and M also satisfy the expressions $45 \leq L \leq 0.65;$ and $0.15 \leq M \leq 0.25.$ 6. The method of forming a capacitor according to claim 5, wherein:
N also satisfies the expression $0.20 \leq N \leq 0.27.$ 7. The method of forming a capacitor according to claim 5, wherein:
the alkyl acrylic acid consists essentially of methyl acrylic acid and M also satisfies the expression $0.17 \leq M \leq 0.25.$ 8. The method of forming a capacitor according to claim 4, wherein:
the alkyl acrylic acid is selected from a group of consisting of the $C_1$-$C_4$ acrylic acids and mixtures thereof; and
the hydroxy alkyl methacrylate is selected from a group of consisting of the $C_1$-$C_4$ hydroxy alkyl methacrylates and mixtures thereof.

9. The method of forming a capacitor according to claim 8, wherein:
the alkyl acrylic acid includes a major portion of methyl acrylic acid; and
the hydroxy alkyl methacrylate includes a major portion of hydroxy ethyl methacrylate.

10. The method of forming a capacitor according to claim 4, wherein:
the alkyl acrylic acid consists essentially of methyl acrylic acid; and
the hydroxy alkyl methacrylate consists essentially of hydroxy ethyl methacrylate.

11. A method of forming a semiconductor device comprising:
forming an electric element on a semiconductor substrate;
forming an insulating layer on the electric element;

forming an opening in the insulating layer to expose a contact region on the electric element;

forming a conductive layer on an upper surface of the insulating layer and a lower surface and sidewalls of the opening;

forming a buffer layer on the conductive layer, the buffer layer filling the opening and including a major portion of a copolymer having from 61 to 75 weight percent benzyl methacrylate; from 8 to 15 weight percent alkyl acrylic acid; and with a remainder being hydroxy alkyl methacrylate;

removing an upper portion of the buffer layer using a developer solution to expose an upper portion of the conductive layer, a lower portion of the buffer layer substantially filling the opening;

removing the upper portion of the conductive layer to separate lower electrode structures;

removing the lower portion of the buffer layer and the insulating layer;

forming a dielectric layer on the lower electrode structures; and forming an upper electrode on the dielectric layer.

12. The method of forming a semiconductor device according to claim 11, wherein:
the developer solution includes from 1 to 5 wt % tetramethyl ammonium hydroxide in an aqueous solution.

13. The method of forming a semiconductor device according to claim 12, wherein:
removing the upper portion of the buffer layer using a developer solution maintains an average removal rate of at least 30 Å/second.

14. The method of forming a semiconductor device according to claim 11, wherein:
removing the lower portion of the buffer layer includes an ashing process that maintains an average removal rate of at least 150 Å/second.

* * * * *